US011636841B2

(12) United States Patent
Cattell et al.

(10) Patent No.: US 11,636,841 B2
(45) Date of Patent: Apr. 25, 2023

(54) AUTOMATIC GAIN CONTROL IN AN ACTIVE NOISE REDUCTION (ANR) SIGNAL FLOW PATH

(71) Applicant: Bose Corporation, Framingham, MA (US)

(72) Inventors: Joseph H. Cattell, Somerville, MA (US); Ricardo F. Carreras, Southborough, MA (US)

(73) Assignee: Bose Corporation, Framingham, MA (US)

( * ) Notice: Subject to any disclaimer, the term of this patent is extended or adjusted under 35 U.S.C. 154(b) by 0 days.

(21) Appl. No.: 16/835,750

(22) Filed: Mar. 31, 2020

(65) Prior Publication Data
US 2020/0227022 A1    Jul. 16, 2020

Related U.S. Application Data

(63) Continuation of application No. 15/473,939, filed on Mar. 30, 2017, now Pat. No. 10,614,790.

(51) Int. Cl.
*G10K 11/178*      (2006.01)
*H03G 3/30*        (2006.01)
(Continued)

(52) U.S. Cl.
CPC ...... *G10K 11/178* (2013.01); *G10K 11/17853* (2018.01); *G10K 11/17881* (2018.01);
(Continued)

(58) Field of Classification Search
CPC ........... G10K 11/178; G10K 11/17853; G10K 11/17885; G10K 11/17881;
(Continued)

(56) References Cited

U.S. PATENT DOCUMENTS 3,803,357 A * 4/1974 Sacks ................. H03H 11/0405
                                                    381/94.8
4,158,190 A    6/1979 Stefanov
(Continued)

FOREIGN PATENT DOCUMENTS

EP    3128760    2/2017
GB    2455823    6/2009
(Continued)

OTHER PUBLICATIONS

Digital Signal Processing/Digital Filters. Wikibooks, Feb. 18, 2014, https://en.wikibooks.org/w/index.php?title=Digital_Signal_Processing/Digital_Filters&oldid=26099 74; 4 pages.
(Continued)

*Primary Examiner* — Matthew A Eason
*Assistant Examiner* — Kuassi A Ganmavo
(74) *Attorney, Agent, or Firm* — Fish & Richardson P.C.

(57) ABSTRACT

The technology described in this document can be embodied in a method that includes receiving an input signal captured by one or more sensors associated with an active noise reduction (ANR) headphone, and determining one or more characteristics of a first portion of the input signal. Based on the one or more characteristics of the first portion of the input signal, a gain of a variable gain amplifier (VGA) disposed in an ANR signal flow path can be adjusted, and accordingly, a set of coefficients for a tunable digital filter disposed in the ANR signal flow path can be selected. The method further includes processing a second portion of the input signal in the ANR signal flow path using the adjusted gain and selected set of coefficients to generate a second output signal for the electroacoustic transducer of the ANR headphone.

19 Claims, 19 Drawing Sheets

(51) Int. Cl.
*H04R 1/10* (2006.01)
*H03G 3/32* (2006.01)
*H04R 3/00* (2006.01)

(52) U.S. Cl.
CPC ..... *G10K 11/17885* (2018.01); *H03G 3/3005* (2013.01); *H03G 3/32* (2013.01); *H04R 1/1083* (2013.01); *G10K 2210/1081* (2013.01); *G10K 2210/3028* (2013.01); *G10K 2210/3056* (2013.01); *H04R 1/1041* (2013.01); *H04R 3/005* (2013.01); *H04R 2410/05* (2013.01); *H04R 2430/01* (2013.01); *H04R 2460/01* (2013.01); *H04R 2499/11* (2013.01)

(58) Field of Classification Search
CPC ... G10K 2210/1081; G10K 2210/3028; G10K 2210/3056; H03G 3/3005; H03G 3/32; H04R 1/1083; H04R 1/1041; H04R 3/005; H04R 2430/01; H04R 2499/11
See application file for complete search history.

(56) References Cited

U.S. PATENT DOCUMENTS

| | | | |
|---|---|---|---|
| 4,966,160 A | 10/1990 | Birck et al. | |
| 4,996,712 A | 2/1991 | Laurence et al. | |
| 5,425,105 A | 6/1995 | Lo et al. | |
| 5,388,160 A | 7/1995 | Hashimoto et al. | |
| 5,771,297 A | 6/1998 | Richardson | |
| 6,233,548 B1 | 5/2001 | Schwartz et al. | |
| 6,801,629 B2 | 10/2004 | Brimhall | |
| 6,865,274 B1* | 3/2005 | Aarts | H04R 3/007 381/98 |
| 8,073,150 B2 | 12/2011 | Joho et al. | |
| 8,073,151 B2 | 12/2011 | Joho et al. | |
| 8,189,799 B2 | 5/2012 | Shridhar et al. | |
| 8,222,641 B2 | 7/2012 | Yamkovoy et al. | |
| 8,432,068 B2 | 4/2013 | Yamkovoy | |
| 8,666,083 B2 | 3/2014 | Yamkovoy et al. | |
| 8,841,799 B2 | 9/2014 | Yamkovoy et al. | |
| 9,082,388 B2 | 7/2015 | Annunziato et al. | |
| 9,749,731 B2 | 8/2017 | Yeo | |
| 9,881,601 B2 | 1/2018 | Bames et al. | |
| 9,965,855 B2 | 5/2018 | Kim | |
| 10,553,195 B2 | 2/2020 | O'Connell et al. | |
| 10,580,398 B2 | 3/2020 | Cattell | |
| 10,614,790 B2 | 4/2020 | Cattell et al. | |
| 2002/0122562 A1 | 9/2002 | Brennan et al. | |
| 2005/0175187 A1* | 8/2005 | Wright | G10K 11/17854 381/71.12 |
| 2007/0136050 A1 | 6/2007 | Tourwe | |
| 2008/0112569 A1* | 5/2008 | Asada | G10K 11/17875 381/71.1 |
| 2008/0175397 A1* | 7/2008 | Holman | H04R 3/08 381/55 |
| 2009/0034748 A1 | 2/2009 | Sibbald | |
| 2010/0177905 A1 | 7/2010 | Shridhar et al. | |
| 2010/0246836 A1 | 9/2010 | Johnson et al. | |
| 2010/0260345 A1 | 10/2010 | Shridhar et al. | |
| 2010/0272275 A1 | 10/2010 | Carreras et al. | |
| 2010/0272281 A1 | 10/2010 | Carreras et al. | |
| 2010/0272283 A1 | 10/2010 | Carreras et al. | |
| 2011/0007907 A1 | 1/2011 | Park et al. | |
| 2011/0222700 A1 | 9/2011 | Bhandari | |
| 2011/0243343 A1 | 10/2011 | Gauger et al. | |
| 2012/0014529 A1 | 1/2012 | Yamkovoy | |
| 2012/0057720 A1 | 3/2012 | Van Leest | |
| 2012/0316869 A1 | 12/2012 | Xiang et al. | |
| 2013/0315411 A1 | 11/2013 | Annunziato et al. | |
| 2013/0336494 A1 | 12/2013 | Bathgate et al. | |
| 2013/0343557 A1 | 12/2013 | Sontacchi et al. | |
| 2014/0126736 A1 | 5/2014 | Gauger et al. | |
| 2014/0363010 A1 | 12/2014 | Christopher et al. | |
| 2014/0379355 A1 | 12/2014 | Hosokawsa | |
| 2015/0023516 A1 | 1/2015 | Rabii et al. | |
| 2015/0104031 A1 | 4/2015 | Park et al. | |
| 2015/0154950 A1 | 6/2015 | Ring | |
| 2015/0264469 A1* | 9/2015 | Murata | G10K 11/17875 381/71.1 |
| 2016/0094917 A1 | 3/2016 | Wilk et al. | |
| 2016/0173983 A1* | 6/2016 | Berthelsen | H03G 9/025 381/55 |
| 2018/0151172 A1* | 5/2018 | Min | G10K 11/17813 |
| 2018/0286373 A1 | 10/2018 | O'Connell et al. | |
| 2018/0286374 A1 | 10/2018 | Cattell et al. | |
| 2018/0286375 A1 | 10/2018 | Cattell et al. | |

FOREIGN PATENT DOCUMENTS

| | | | | |
|---|---|---|---|---|
| JP | H6177688 A | * | 6/1994 | |
| JP | 2012/529061 | | 11/2012 | |
| WO | WO-2005041618 A1 | * | 5/2005 | ........... H04R 29/001 |
| WO | WO 2007011337 | | 1/2007 | |
| WO | WO 2010/129219 | | 11/2010 | |
| WO | WO 2010/129272 | | 11/2010 | |
| WO | WO 2010/131154 | | 11/2010 | |
| WO | WO 2016/054186 | | 4/2016 | |

OTHER PUBLICATIONS

International Preliminary Report on Patentability in Appln. No. PCT/US2018/025196, dated Oct. 1, 2019, 15 pages.
International Search Report and Written Opinion; PCT/US2014/040641; dated Feb. 5, 2015; 9 pages.
Notice of Reasons for Rejection, with English Translation; Appln. No. 2016-519539; dated Dec. 21, 2016; 6 pages.
Reithmeier et al., Adaptive feedforward control for active noise cancellation in-ear headphone, 2013.
Siravara et al.; "A Novel Approach for Single Microphone Active Noise Cancellation"; IEEE; 2002; 4 pages.
PCT International Search Report and Written Opinion in International Appln. No. PCT/US2018/025196, dated Oct. 23, 2018, 19 pages.

* cited by examiner

AUTOMATIC GAIN CONTROL IN AN ACTIVE NOISE REDUCTION (ANR) SIGNAL FLOW PATH

CLAIM OF PRIORITY

This application claims priority under 35 USC § 119(e) to U.S. patent application Ser. No. 15/473,939, filed on Mar. 30, 2017, the entire contents of which are hereby incorporated by reference.

TECHNICAL FIELD

This disclosure generally relates to technology for controlling overload conditions in active noise reducing (ANR) devices.

BACKGROUND

ANR devices can utilize one or more digital signal processors (DSPs) for implementing various signal flow topologies. Examples of such DSPs are described in U.S. Pat. Nos. 8,073,150 and 8,073,151, which are incorporated herein by reference in their entirety.

SUMMARY

In general, in one aspect, this document features a method that includes receiving an input signal captured by one or more sensors associated with an ANR headphone, and determining, by one or more processing devices in an ANR signal flow path, one or more characteristics of a first portion of the input signal. The method also includes automatically adjusting, by the one or more processing devices based on the one or more characteristics of the first portion of the input signal, a gain of a variable gain amplifier (VGA) disposed in the ANR signal flow path, and selecting, by the one or more processing devices, a set of coefficients for a tunable digital filter disposed in the ANR signal flow path. The set of coefficients are selected in accordance with the gain of the VGA. The method further includes processing a second portion of the input signal in the ANR signal flow path using the adjusted gain and selected set of coefficients to generate a second output signal for the electroacoustic transducer of the ANR headphone.

In another aspect, this document features an active noise reduction (ANR) device. The device includes one or more sensors configured to generate an input signal indicative of an external environment of the ANR device, and a variable gain amplifier (VGA) and a tunable digital filter disposed in an ANR signal flow path of the ANR device. The ANR signal flow path is connected to an electroacoustic transducer of the ANR device. The device further includes one or more processing devices configured to determine one or more characteristics of a first portion of the input signal, automatically adjust, based on the one or more characteristics of the first portion of the input signal, a gain of the VGA, and select a set of coefficients for the tunable digital filter, wherein the set of coefficients are selected in accordance with the gain of the VGA.

In another aspect, this document features one or more machine-readable storage devices having encoded thereon computer readable instructions for causing one or more processing devices to perform various operations. The operations include receiving an input signal captured by one or more sensors associated with an ANR headphone, and determining one or more characteristics of a first portion of the input signal. The operations further include automatically adjusting, based on the one or more characteristics of the first portion of the input signal, a gain of a variable gain amplifier (VGA) disposed in the ANR signal flow path, and selecting, a set of coefficients for a tunable digital filter disposed in the ANR signal flow path. The set of coefficients are selected in accordance with the gain of the VGA. The operations also include processing a second portion of the input signal in the ANR signal flow path using the adjusted gain and selected set of coefficients to generate a second output signal for the electroacoustic transducer of the ANR headphone.

Implementations of the above aspects may include one or more of the following features. Determining the one or more characteristics of the first portion of the input signal can include processing the first portion of the input signal to generate a first output signal for an electroacoustic transducer of the ANR device, and determining the one or more characteristics of the first portion of the input signal based on one or more characteristics of the first output signal. The one or more sensors can include one of: a feedforward microphone of the ANR device, a feedback microphone of the ANR device, a pressure sensor, an accelerometer, and a displacement sensor configured to sense an amount of excursion of the electroacoustic transducer. The ANR signal flow path can include a feedforward path disposed between a feedforward microphone of the ANR device and the electroacoustic transducer. The ANR signal flow path can include a feedback path disposed between a feedback microphone of the ANR headphone and the electroacoustic transducer. The VGA gain adjustments may be deactivated responsive to a first user-input received by an input-device of the ANR device. The VGA gain adjustments may also be reactivated responsive to a second user-input received by the input-device of the ANR headphone. The gain of the VGA can be adjusted periodically during an operation of the ANR headphone. The gain of the VGA can be adjusted responsive to determining that the one or more characteristics of the first portion of the input signal satisfies a threshold condition. The one or more characteristics of the first portion of the input signal can be indicative of a noise floor of an external environment of the ANR headphone. Determining the one or more characteristics of the first portion of the input signal based on one or more characteristics of the first output signal can include determining that the first output signal is clipped. The one or more characteristics of the first portion of the input signal can be indicative of a likelihood that an output signal resulting from processing of the first portion of the input signal by the ANR signal flow path would be clipped.

Various implementations described herein may provide one or more of the following advantages. By throttling compensation under overload conditions only in a selected portion of the frequency range, the performance of small form-factor ANR devices (e.g., in-ear headsets) may be improved. For example, selective throttling in the low frequency range may allow for mitigating overload conditions while avoiding potentially objectionable noise modulations that may occur due to turning off the entire feedforward compensation. Because the human ear is relatively less sensitive to low frequencies (e.g., sub-100 Hz), throttling the compensation at such low frequencies upon detection of an overload condition may have an insignificant effect on the psychoacoustic experience of the user, and therefore may improve the overall user experience as compared to a device that completely shuts off the compensation in an ANR signal flow path (e.g., a feedforward path or a feedback path) upon detection of overload. In addition to, or independently of the processing in one ANR signal flow path (e.g., a feedforward path), a tunable filter may be disposed in the same or another ANR signal flow path (e.g., a feedback path) to mitigate overload conditions due to low frequency stimuli detected by a corresponding microphone (e.g., a feedback microphone in this particular example). In some cases, the tunable filter (which may be implemented, for example, as a high-pass or notch filter) may improve user experience and driver-life by reducing low frequency displacement of the driver resulting from, for example, jaw motion or walking. In some implementations, by providing a variable gain amplifier (VGA) disposed in series with a tunable filter in a signal flow path (e.g., a feedback path or a feedforward path), the noise reduction performance of an ANR device may be adaptively balanced with its overload characteristics. For example, in some cases, increasing the gain of the VGA may result in a better signal-to-noise ratio (SNR) at the cost of a decreased dynamic range and/or an increased likelihood of being driven to overload conditions. Automatic and simultaneous adjustments of both the VGA and the tunable filter may therefore be used in making an ANR device adaptive to various different environments, thereby improving the overall user experience.

Two or more of the features described in this disclosure, including those described in this summary section, may be combined to form implementations not specifically described herein. The details of one or more implementations are set forth in the accompanying drawings and the description below. Other features, objects, and advantages will be apparent from the description and drawings, and from the claims.

DETAILED DESCRIPTION

Figure 1:
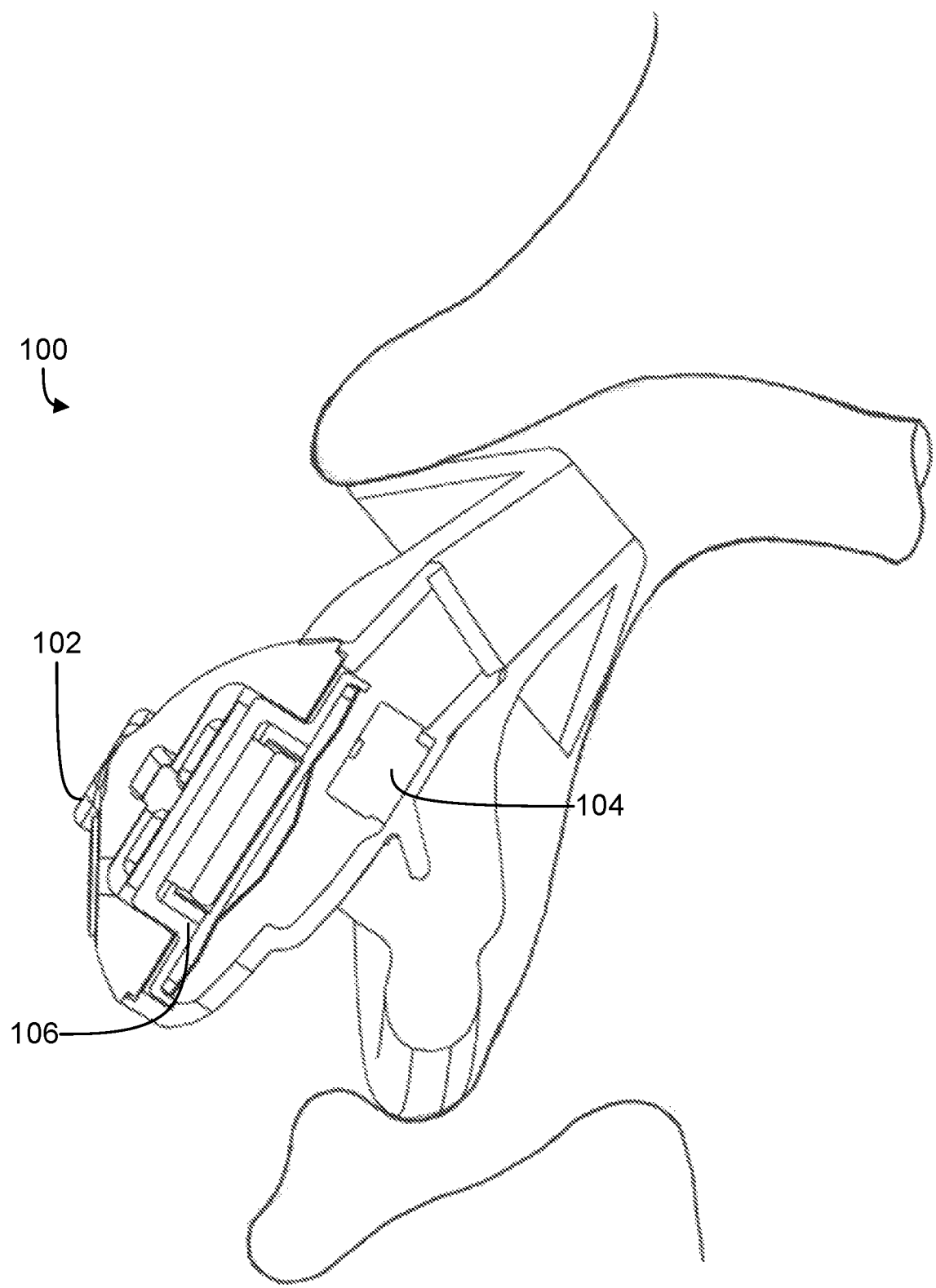
FIG. 1 shows an in-the-ear active noise reduction (ANR) headphone.

An active noise reduction (ANR) device can include a configurable digital signal processor (DSP), which can be used for implementing various signal flow topologies and filter configurations. Examples of such DSPs are described in U.S. Pat. Nos. 8,073,150 and 8,073,151, which are incorporated herein by reference in their entirety. U.S. Pat. No. 9,082,388, also incorporated herein by reference in its entirety, describes an acoustic implementation of an in-ear active noise reducing (ANR) headphone, as shown in FIG. 1. This headphone 100 includes a feedforward microphone 102, a feedback microphone 104, an output transducer 106 (which may also be referred to as an electroacoustic transducer or acoustic transducer), and a noise reduction circuit (not shown) coupled to both microphones and the output transducer to provide anti-noise signals to the output transducer based on the signals detected at both microphones. An additional input (not shown in FIG. 1) to the circuit provides additional audio signals, such as music or communication signals, for playback over the output transducer 106 independently of the noise reduction signals.

The term headphone, which is interchangeably used herein with the term headset, includes various types of personal acoustic devices such as in-ear, around-ear or over-the-ear headsets, earphones, and hearing aids. The headsets or headphones can include an earbud or ear cup for each ear. The earbuds or ear cups may be physically tethered to each other, for example, by a cord, an over-the-head bridge or headband, or a behind-the-head retaining structure. In some implementations, the earbuds or ear cups of a headphone may be connected to one another via a wireless link.

Figure 2:
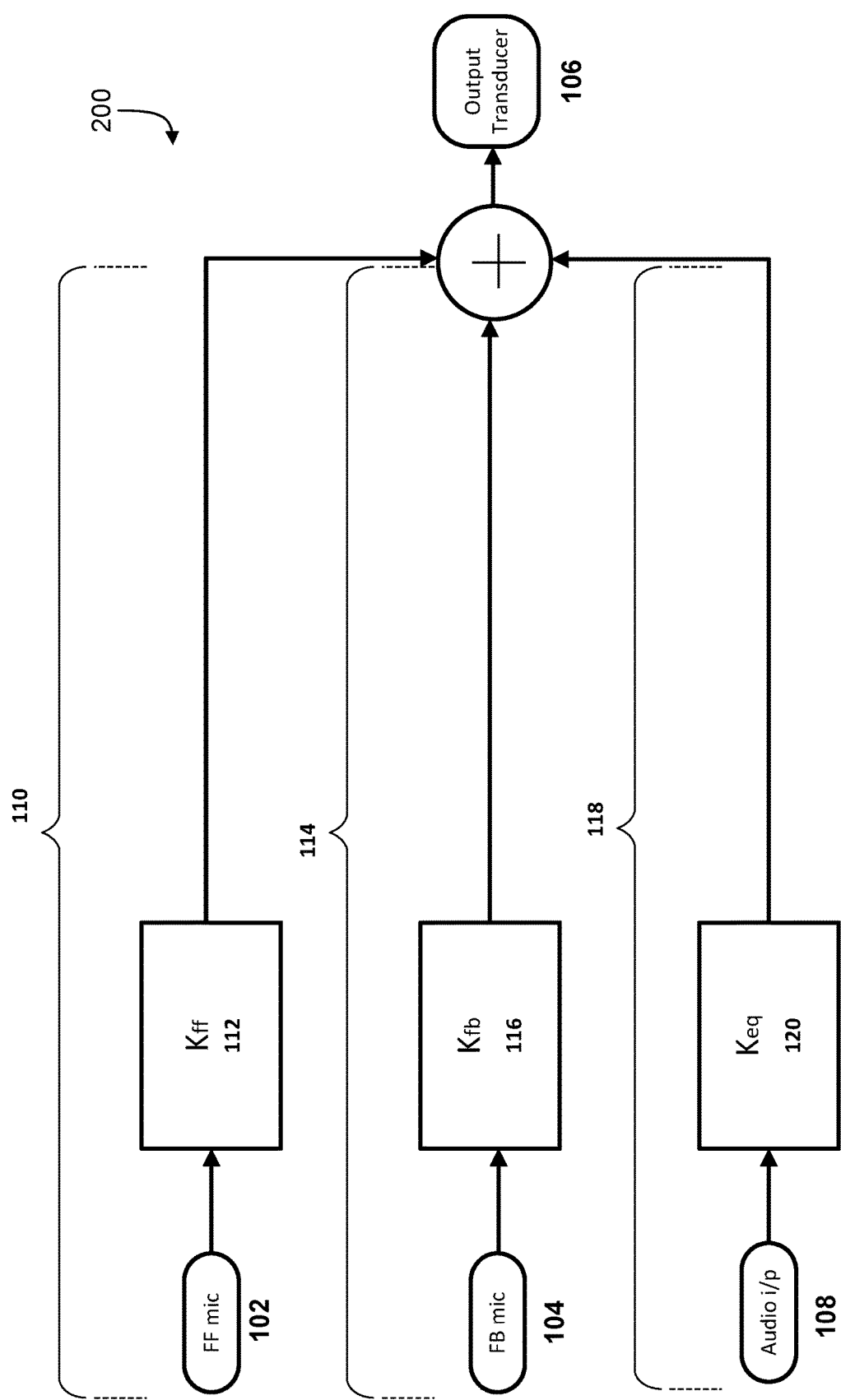
FIG. 2 is a block diagram of an ANR device.

Various signal flow topologies can be implemented in an ANR device to enable functionalities such as audio equalization, feedback noise cancellation, feedforward noise cancellation, etc. For example, as shown in the example block diagram of an ANR device 200 in FIG. 2, the signal flow topologies can include a feedforward noise reduction path 110 that drives the output transducer 106 to generate an anti-noise signal (using, for example, a feedforward compensator 112) to reduce the effects of a noise signal picked up by the feedforward microphone 102. In another example, the signal flow topologies can include a feedback noise reduction path 114 that drives the output transducer 106 to generate an anti-noise signal (using, for example, a feedback compensator 116) to reduce the effects of a noise signal picked up by the feedback microphone 104. The signal flow topologies can also include an audio path 118 that includes circuitry (e.g., equalizer 120) for processing input audio signals 108 such as music or communication signals, for playback over the output transducer 106.

During most operating conditions, the acoustic noise energy that the ANR device attempts to reduce is small enough to keep the system hardware within capacity. However, in some circumstances, discrete acoustic signals or low frequency pressure disturbances (e.g., loud pops, bangs, door slams, etc.) picked up by the feedforward or feedback microphones can cause the noise reduction circuitry to overrun the capacity of the electronics or the output transducer 106 in trying to reduce the resulting noise, thereby creating audible artifacts which may be deemed objectionable by some users. These conditions, which are referred to herein as overload conditions, can be manifested by, for example, clipping of amplifiers, hard excursion limits of acoustic drivers or transducers, or levels of excursion that cause sufficient change in the acoustics response so as to cause oscillation. The problem of overload conditions can be particularly significant in small form-factor ANR devices such as in-ear headphones. For example, in order to compensate for low frequency pressure disturbances (e.g., a bus going over a pothole, a door slam, or the sound of an airplane taking off), the feedforward compensator may generate a signal that would require the acoustic transducer to exceed the corresponding physical excursion limit. Due to acoustic leaks, the excursion or driver displacement to create a given pressure typically increases with decreasing frequencies. For example, a particular acoustic transducer may need to be displaced 1 mm to generate an anti-noise signal for a 100 Hz noise, 2 mm to generate an anti-noise signal for a 50 Hz noise, and so on. Many acoustic transducers, particularly small transducers used in small form-factor ANR devices are physically incapable of producing such large displacements. In such cases, the demand of the high displacement by a compensator can cause the transducer to generate sounds that cause audible artifacts, which may contribute to an objectionable user experience. The audible artifacts can include oscillations, potentially objectionable transient sounds (e.g., "thuds," "cracks," "pops," or "clicks"), or crackling/buzzing sounds.

Figure 3A:
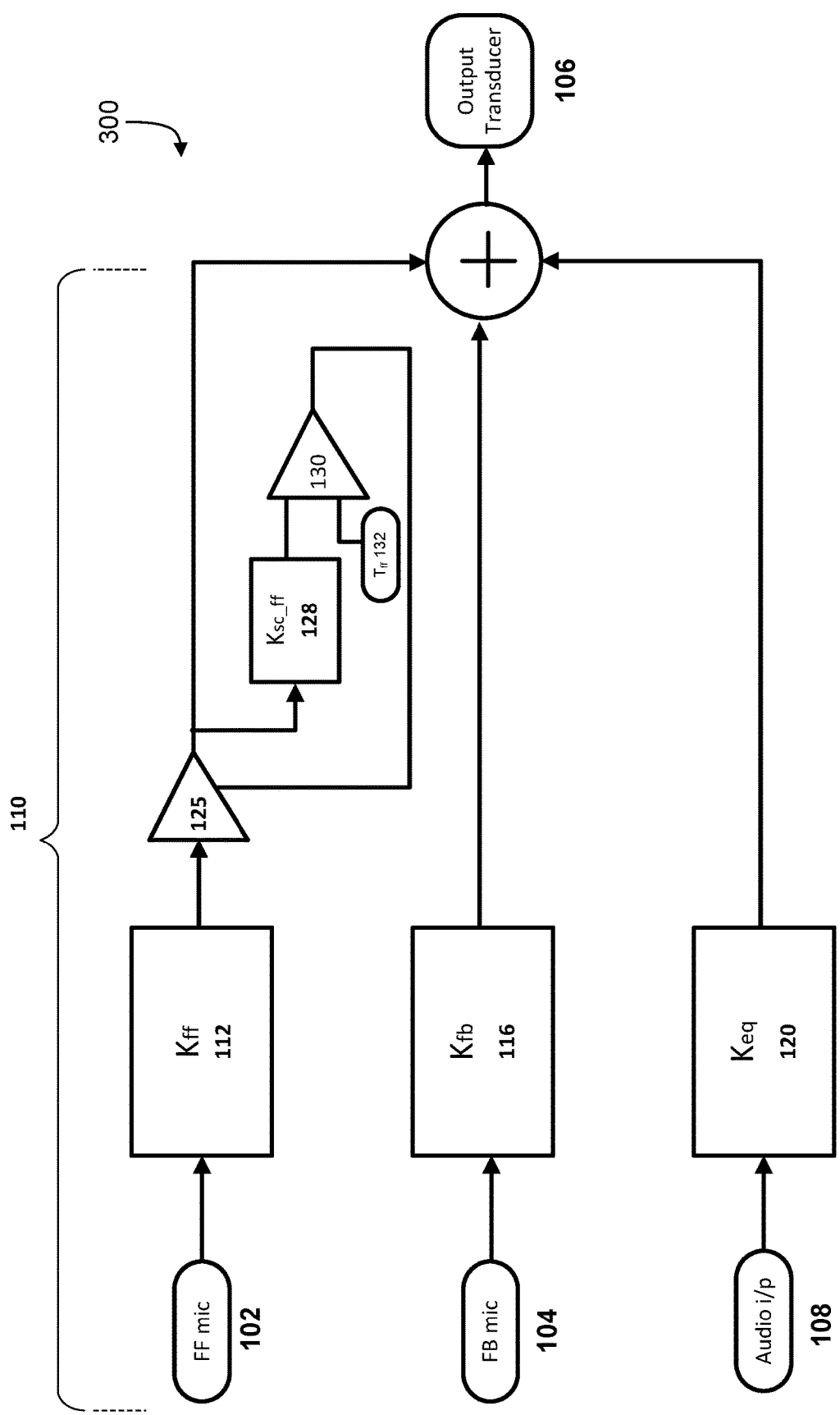
FIG. 3A is an example of a block diagram of an ANR device with feedforward compression.

In some cases, such artifacts can be reduced by temporarily lowering the gain along selected portions of the signal processing pathways (also referred to herein as "throttling"), such that a transient increase in noise from the lowering of the gain is potentially less objectionable to a user than the artifact being addressed. For example, as shown in the block diagram of an example ANR device 300 in FIG. 3A, the feedforward path 110 can include a variable gain amplifier (VGA) 125, the gain of which can be reduced (throttled) upon detection of a signal that can potentially overload the output transducer 106. This can be done, for example, using a sidechain filter 128, which is a filter that is applied to a signal sampled from the main signal flow to generate a test signal for determining whether or not to throttle the gain of the VGA 125. For example, the output of the VGA 125 can be passed through the sidechain filter 128 (the transfer function of which is denoted as $K_{sc\_ff}$) connected to the feedforward path 110, and the output of the sidechain filter is compared (using, for example, a comparator 130) to a pre-determined threshold, $T_{ff}$ 132 to decide whether an overload condition exists. The output of the comparator 130 is provided to the variable gain amplifier (VGA) 125. If the comparator 130 detects that the filtered output signal is greater than the threshold $T_{ff}$, the gain of the VGA 125 is adjusted to throttle the signal in the feedforward path 110 to mitigate the overload condition. While FIG. 3A shows a sidechain filter only for the feedforward path, a similar sidechain filter may also be implemented in the feedback path. Also, the sidechain filters may be disposed in the feedforward or feedback paths before or after the corresponding main compensators 112 or 116, respectively.

In some cases, reducing the gain of the entire feedforward or feedback path may also generate some undesirable audible artifacts and/or noise modulations. For example, if the noise that causes an overload condition has significant energy at low and high frequencies, turning off or significantly reducing the gain of the feedforward compensator may allow the noise to pass through un-attenuated and may create an uncomfortable or objectionable experience for some users. The technology described herein may improve user experience in such cases by allowing gain adjustments in only selected frequency ranges upon detection of an overload condition, while allowing compensation signals to be generated at frequencies outside of the selected range. For example, because noise reduction compensation in the lower end of the frequency spectrum (e.g., below 100 Hz) is often the dominant reason for creating overload conditions, the feedforward compensation may be throttled only in the low frequency portion of the spectrum, while allowing feedforward compensation to continue for other frequencies. This may provide an improved psychoacoustic experience for users because upon detection of a low frequency disturbance, the feedforward compensation is temporarily suspended only in a selected portion of the frequency range. If the selected frequency range is in the sub-100 Hz region, the user experience is not significantly degraded for most users because human ears are typically not very sensitive to noise in that frequency range.

Figure 3B:
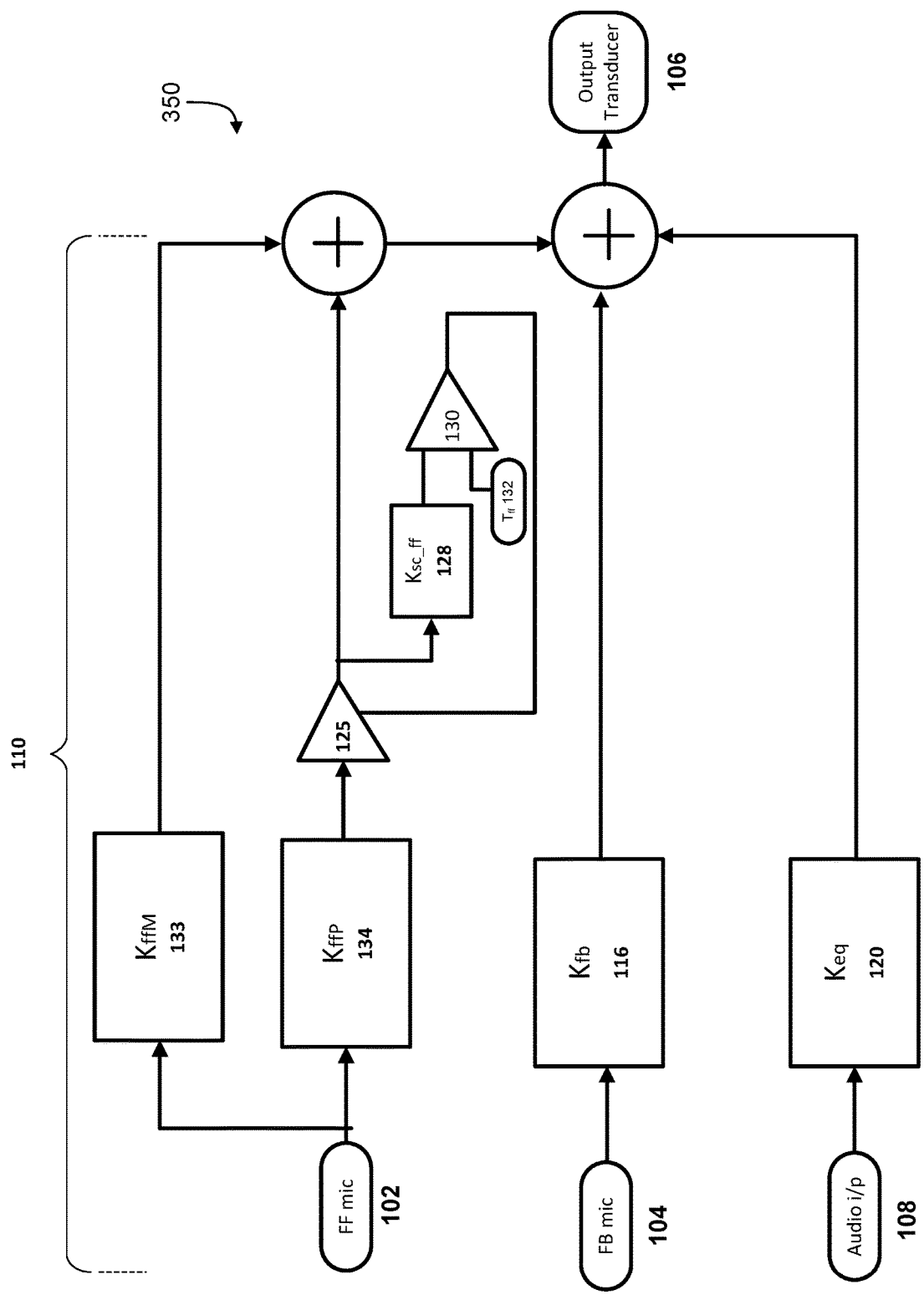
FIG. 3B is an example of a block diagram of an ANR device with parallel feedforward compression.

FIG. 3B is a block diagram of an example of an ANR device 350 with parallel feedforward compression, in which feedforward compensation is throttled in only a portion of the operating frequency range upon detection of an overload condition in that frequency range. The device 350 includes, in the feedforward path 110, at least two parallel paths each processing a different portion of the operating frequency range. For example, the feedforward path 110 can include a main feedforward compensator 133 (denoted by the transfer function $K_{ffM}$) which processes a frequency range that substantially excludes frequencies where overload conditions are expected to occur. The feedforward path 110 also includes an auxiliary feedforward compensator 134 (denoted by the transfer function $K_{ffP}$) connected in parallel to the main feedforward compensator 133. The auxiliary feedforward compensator 134 processes the frequency range in which overload conditions are expected to occur. A VGA 125, sidechain filter 128, and comparator 130 are connected to the output of the auxiliary compensator 134 to throttle the compensation in the corresponding frequency range upon detection of an overload condition. However, even when the VGA 125 throttles the feedforward compensation of the auxiliary compensator 134, the main feedforward compensator 133 continues to provide compensation in the corresponding frequency range. For example, the auxiliary compensator can be configured to process signals only in the sub-100 Hz range, such that feedforward compensation due to low frequency pressure disturbances are throttled using the VGA 125. Even when the feedforward compensation by the auxiliary compensator 134 is throttled, the main feedforward compensator 133 (which can be configured to process signals above 100 Hz) continues to provide feedforward compensation to reduce noise in the corresponding frequency range. In some implementations, this improves the overall noise reduction performance of the corresponding ANR device, while limiting audible artifacts that could be caused by low frequency pressure disturbances.

The threshold 132 associated with the comparator 130 may be determined in various ways. In some implementations, the threshold 132 may be determined based on the characteristics of the output transducer. For example, the threshold 132 might be set as a voltage reference point to prevent the drive voltage output by the VGA 125 from causing the output transducer 106 to hit a mechanical limit, or reaching a drive level where the acoustic distortion due to mechanical, magnetic or electrical characteristics is deemed undesirable. In some cases, these limits may be related to equivalent pressure levels in the ear canal. For example, as the size of the output transducer gets smaller, these limits may occur at lower equivalent pressure levels in the ear canal.

In some implementations, the main feedforward compensator 133 and auxiliary feedforward compensator 134 can include filters for isolating corresponding operating frequency ranges. For example, the auxiliary compensator 134 can include a low-pass filter with a passband cut-off frequency substantially equal to 100 Hz. The main feedforward compensator 133 can include, for example, a high pass filter with a stopband cut-off frequency substantially equal to 100 Hz. Other configurations may also be used depending, for example, on the corresponding applications. For example, the main feedforward compensator 133 can include a bandpass filter to isolate a frequency range that excludes frequencies where overload conditions are expected to occur. In some implementations, the passbands of the main and auxiliary feedforward compensators may overlap partially. While FIG. 3B describes the filter topologies only in the feedforward path 110, a similar parallel topology may also be used in the feedback path.

In some implementations, multiple sidechain filters can be used in conjunction with the auxiliary compensator 134. For example, the sidechain filter can be implemented as a filter bank, where a particular sidechain filter is selected based on a mode of operation of the ANR device. For example, if the ANR device is being used in mode where some ambient sounds (e.g., human voice) are allowed to pass through, the sidechain filter selected can be different from one that is selected in a mode in which feedforward compensation is performed for the entire operating frequency range. In some implementations, the filter bank can be implemented using a DSP where a different set of filter coefficients and/or threshold value are selected for the sidechain filter based on an identified operating mode. In some implementations, the main feedforward compensator 133 can be configured to provide noise attenuation in the corresponding frequency range as long as the signal from the feedforward microphone 102 is not clipped. In some implementations, the sidechain filter can be operated based on input from one or more additional sensors. For example, an accelerometer may be used to identify movements by a user (e.g., running, jogging etc.) that may cause an overload condition. In some implementations, historical information on user-behavior may be used to anticipate events that may cause an overload condition. For example, if it is known that a user enters her car every morning at 7:30 am and again every evening at 5 pm, and each time the slamming of the car door results in an overload condition, this information may be used in enabling a proactive throttling of the low frequency portion of the feedforward signal path.

In some implementations, the compensation in an ANR signal flow path (e.g., a feedforward path or a feedback path) corresponding to the acoustic transducer for one ear may be coordinated with the compensation in the corresponding signal flow path of the acoustic transducer for the other ear. For example, if a user is wearing both earbuds of a headphone, such coordination between the corresponding signal flow paths may ensure that the ANR performance in the two ears are substantially similar. In some implementations, the sidechain filters of a signal flow path may be adjusted based on determining whether both earbuds of a headphone are being worn by a user. Sensors that can be used for this purpose include, for example, capacitive sensors or infrared sensors disposed on earbuds or ear cups to determine whether an earbud or ear cup is being worn by a user.

Figure 4:
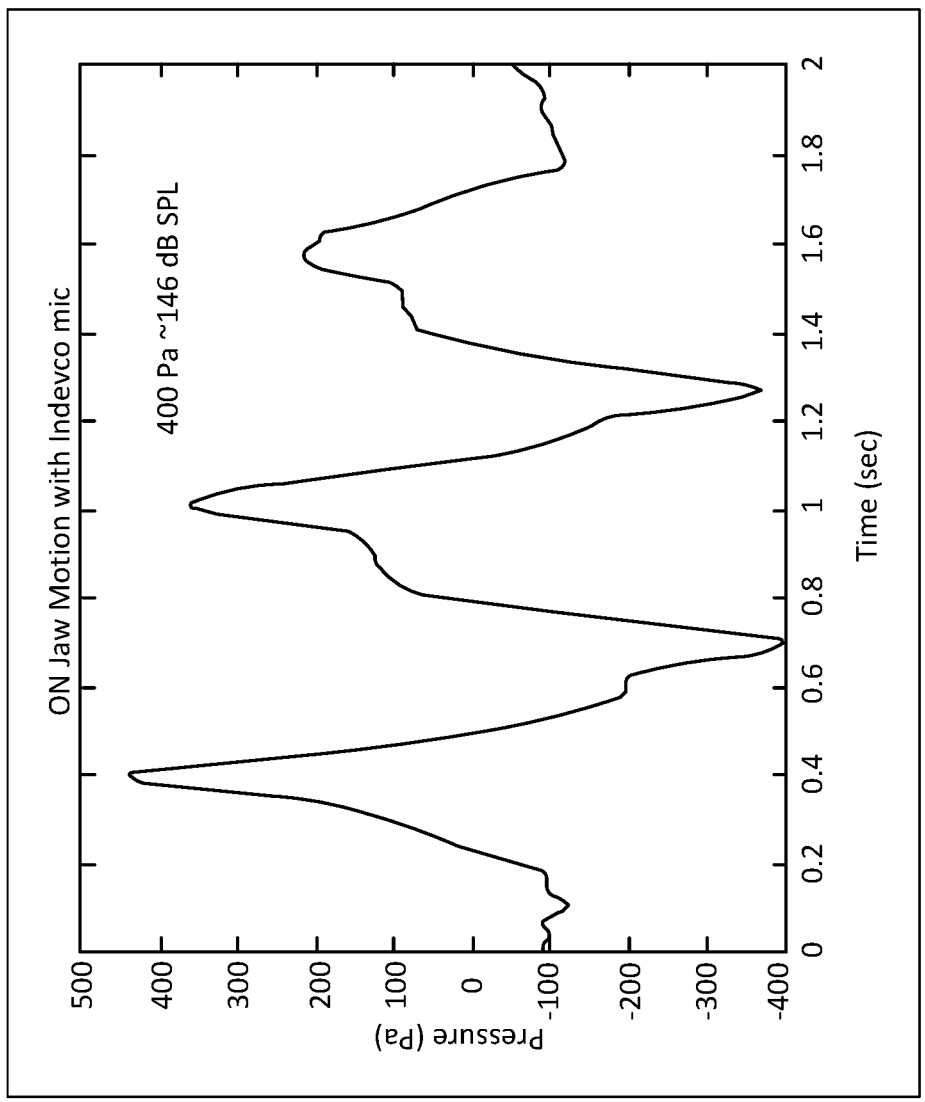
FIG. 4 is a plot showing pressure variations in the ear canal due to the jaw motion of a user using a sealed in-ear headphone.

The above discussions describe the overloading problem of the acoustic transducer primarily with respect to the feedforward path 110. The electroacoustic transducer 106 may also be driven to an overload condition due to stimuli picked up by the feedback microphone 104. For example, in the case of in-ear ANR headphones that are tightly sealed in the ear canal, low frequency stimuli like jaw motion can create large pressure variations that are picked up by the feedback microphone 104. FIG. 4 is a plot showing the pressure variations in the ear canal over a two second time period, which are detected by a feedback microphone. In some cases, for tightly sealed in-ear headphones, low frequency pressure variations (at approximately 15 Hz) may be generated when the user walks on a firm surface. Such low frequency pressure variations of high magnitude, upon being detected by a feedback microphone 104, may cause the feedback compensator 116 to generate a feedback compensation signal that drives the acoustic transducer to an overload condition. This in turn may cause the acoustic transducer 106 to generate audible artifacts and degrade the performance of the ANR device. While the example of a user walking on a firm surface, which generates low frequency variations at approximately 15 Hz, is used herein as one example, other events may cause low frequency variations at different frequencies. The techniques described herein are generally applicable to events that cause low frequency variations that may lead to an overdrive condition, regardless of the particular frequency.

Figure 5A:
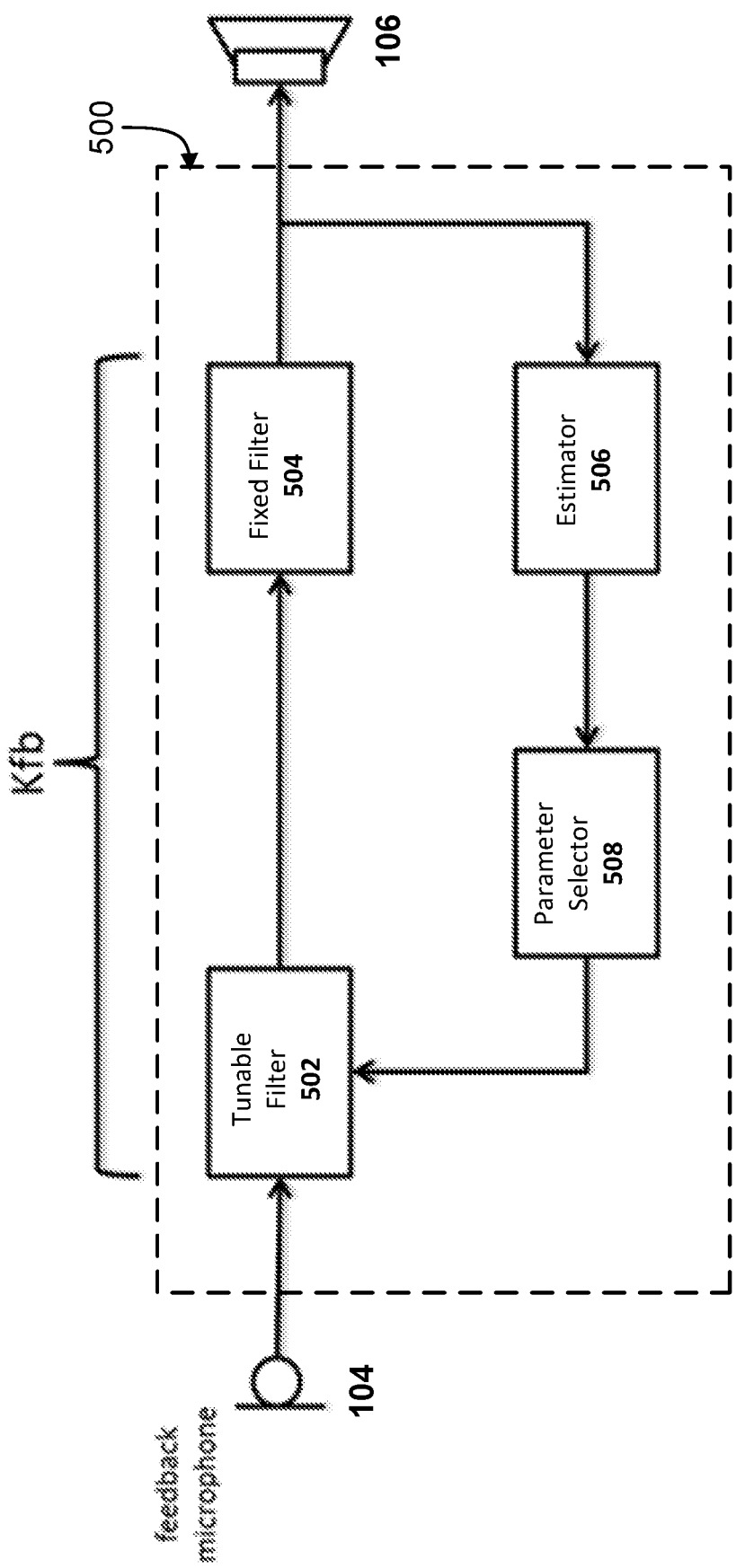
FIG. 5A is a block diagram of a feedback path filter that includes a tunable filter configured to mitigate overload conditions due to low frequency stimuli.

In some implementations, audible artifacts generated due to the low frequency pressure variations in the ear canal may be mitigated by using a tunable filter in the feedback compensator. FIG. 5A is a block diagram of an example of such a feedback compensator 500, which includes a tunable filter 502 configured to mitigate overload conditions due to low frequency stimuli picked up by the feedback microphone 104. The feedback compensator 500 also includes a fixed filter 504 configured to generate the feedback compensation signal for the transducer 106. In some implementations, upon detection of high-magnitude low-frequency stimuli (resulting, for example, from jaw motion or walking), the tunable filter 502 can be configured to filter out such stimuli from the input signal provided to the fixed filter 504 to generate the feedback compensation signal. Under such a signal flow scheme, the feedback compensator can continue to generate feedback compensation signals for noise reduction even in the presence of high-magnitude low-frequency stimuli without being driven to an overload condition.

The parameters for the tunable filter can be selected, for example, by a parameter selector module 508 that determines an appropriate set of parameters based on the output of an estimator 506. In some implementations, the estimator 506 determines, from the feedback compensation signal generated by the fixed filter 504, whether the feedback compensation signal could potentially drive the acoustic transducer 106 into an overload condition. Based on the output of the estimator 506, the parameter selector module 508 can be configured to select one or more parameters (or a set of filter coefficients) for the tunable filter 502, such that the tunable filter 502 filters out the stimuli that is causing the generation of the large feedback compensation signal. The parameter selector module 508 can be configured to access a look-up table to select the one or more parameters (or set of filter coefficients) for the tunable filter 502, based on the extent of driver displacement reported by the estimator 506. In some implementations, the estimator can be configured to monitor the output of the fixed filter 504 to reduce the chances of the output voltage exceeding a threshold condition associated with, for example, driving the output transducer 106 to an unacceptably high displacement, or clipping the electrical output.

Figure 6A:
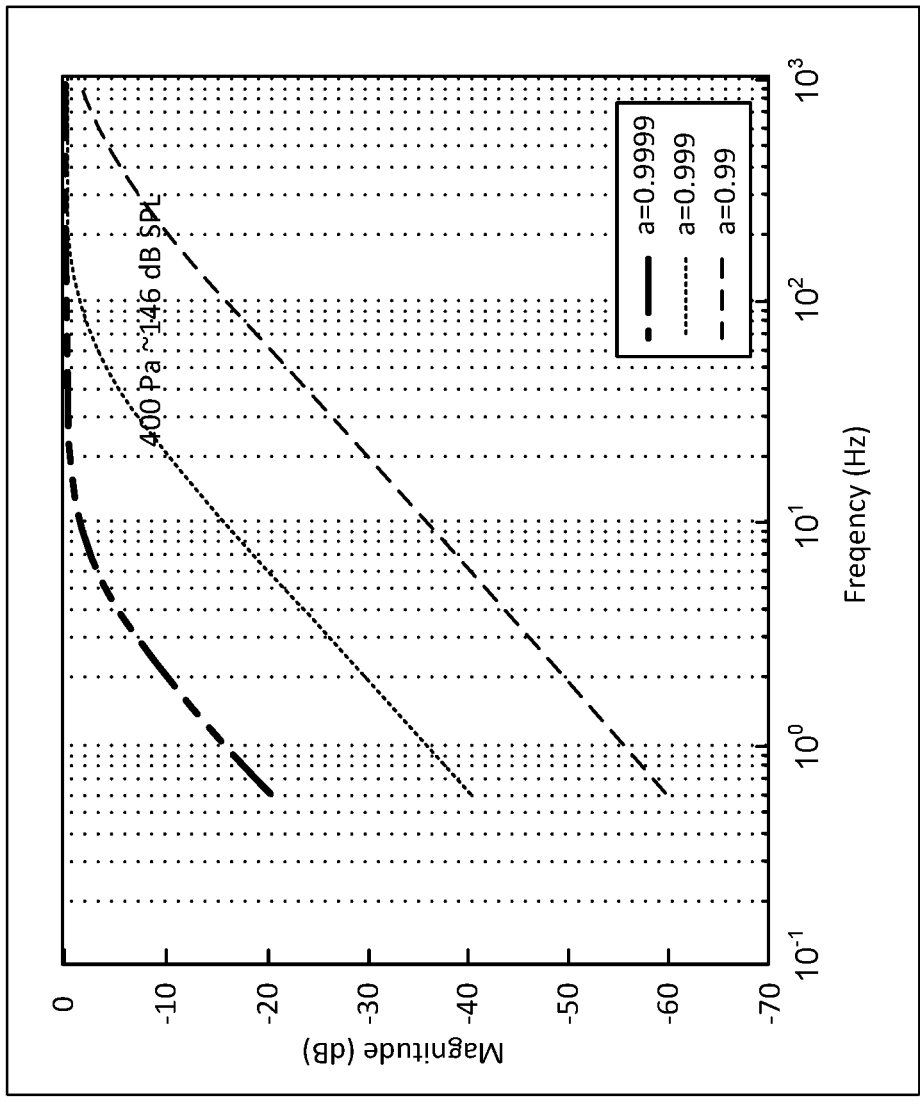
FIGS. 6A-6C are magnitude responses of different tunable high-pass filters.
Figure 6B:
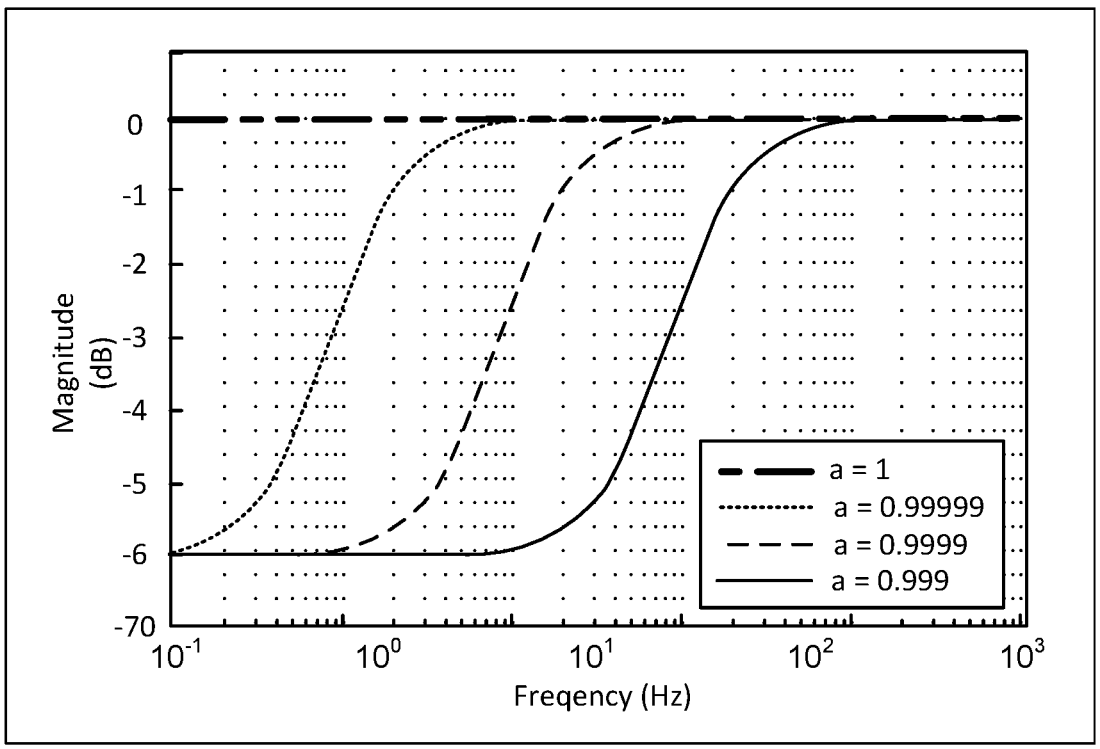
Figure 6C:
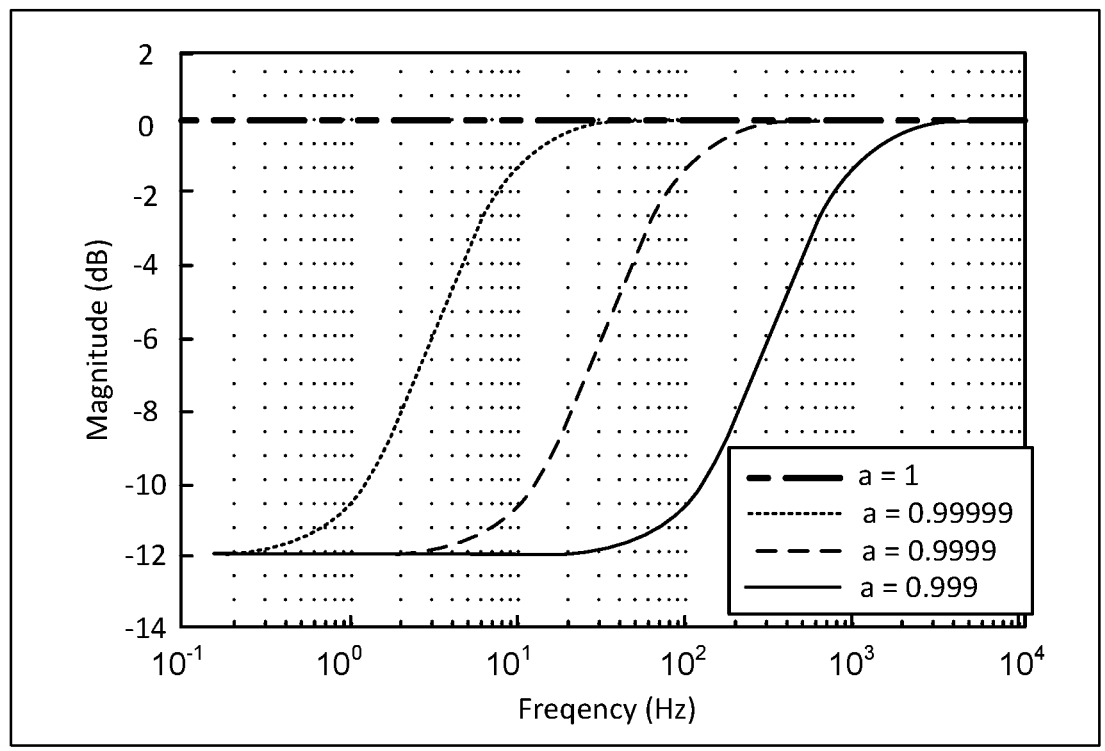

In some implementations, the parameter selector module 508 can be configured to select the one or more parameters or coefficients of the tunable filter 502 such that the tunable filter 502 acts as a high-pass filter. FIGS. 6A-6C show magnitude responses of different tunable high-pass filters parameterized by a parameter a. The transfer function of the filter corresponding to FIG. 6A is given by:

$$H(z, a) = \frac{a(1 - z^{-1})}{1 - az^{-1}} \quad (1)$$

The transfer function of the filter corresponding to FIG. 6B is given by:

$$H(z, a) = \frac{1 - az^{-1}}{1 - a^2 z^{-1}} \quad (2)$$

The transfer function of the filter corresponding to FIG. 6C is given by:

$$H(z, a) = \frac{1 - \sqrt{a}\, z^{-1}}{1 - a^2 z^{-1}} \quad (3)$$

For each of the above transfer functions, selecting the value of a to be equal to unity results in an all-pass filter. However, upon detection of low frequency stimuli that drives the acoustic transducer to an overload condition, the value of a (or a resulting set of filter coefficients) may be chosen in accordance with a desired magnitude response that would filter out the low frequency stimuli.

In some implementations, the parameter selector module 508 can be configured to select the one or more parameters or filter coefficients of the tunable filter 502 such that the tunable filter 502 acts as a notch filter. This can be useful, for example, when the pressure variations causing an overload condition is in a narrow frequency range. For example, when a user walks on a firm surface wearing tightly-sealed in-ear headphones, high-magnitude pressure variations can occur at about 15 Hz. In such cases, a notch filter can be used to prevent such pressure variations from generating feedback signals that could drive the acoustic transducer to an overload. Because only a narrow range of frequencies are suppressed using notch filter, such a filter may only insignificantly degrade the feedback compensation performance of the ANR device.

Figure 5B:
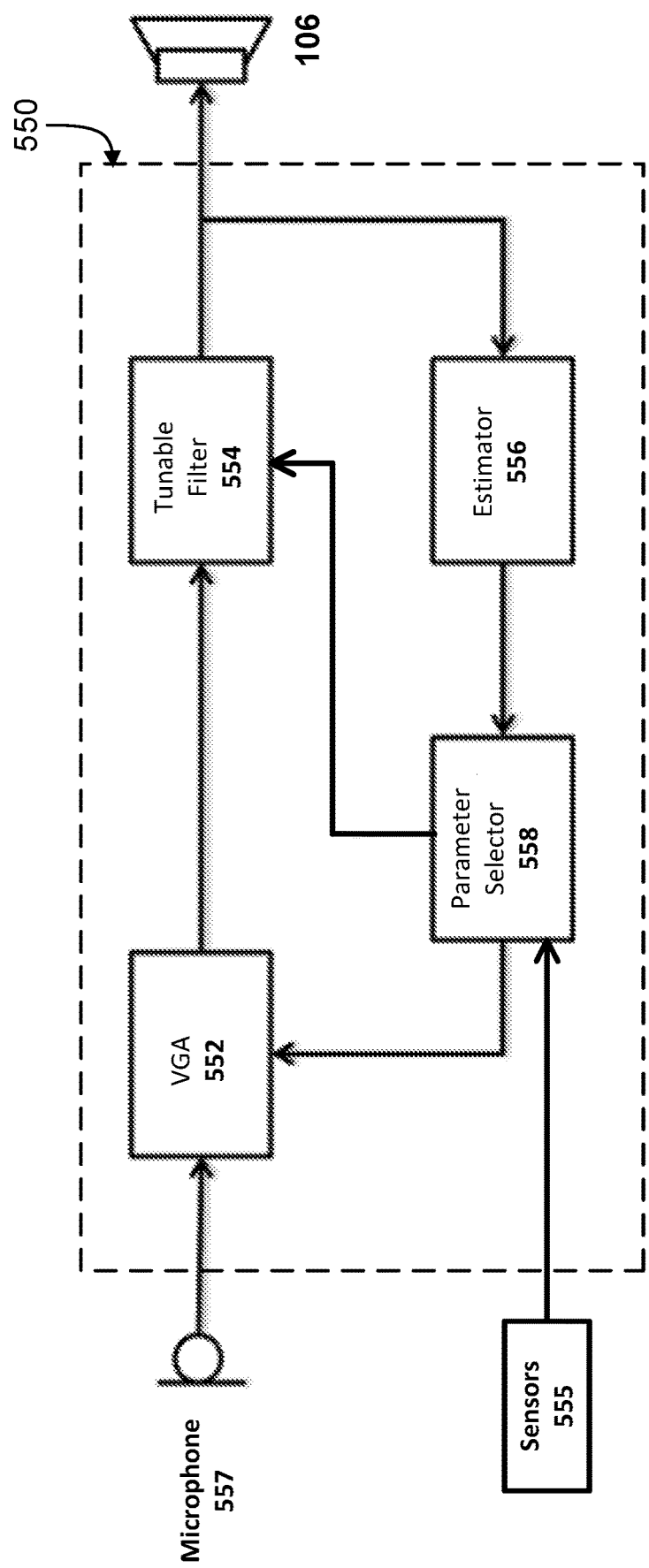
FIG. 5B is a block diagram of an example combination of a variable gain amplifier (VGA) and a tunable filter disposed in a signal flow path of an ANR device.

While the description so far uses examples where the parallel compression is used in a feedforward signal flow path (FIG. 3B) and the tunable filter is used in a feedback signal path (FIG. 5A), each of these techniques may be used in other signal flow paths. For example, the feedforward compression technique may be used in a feedback ANR signal flow path, and a tunable filter may be used in a feedforward ANR signal flow path. FIG. 5B shows a block diagram of another system that may be used in either of a feedforward or a feedback ANR signal flow path. Specifically, FIG. 5B is a block diagram of an example system 550 that uses a combination of a variable gain amplifier (VGA) 552 and a tunable filter 554 disposed in a signal flow path of an ANR device. The signal flow path, which sensor (e.g., a microphone 557 and/or a non-microphone sensor 555) at one end and an acoustic transducer 106 at the other end, can include, for example, a feedback path or a feedforward path of the ANR device. If the signal flow path in which the system 550 is disposed is a feedforward path, the tunable filter 554 may be referred to as a feedforward compensator. If the signal flow path in which the system 550 is disposed is a feedback path, the tunable filter 554 may be referred to as a feedback compensator.

In some implementations, the noise reduction performance of the ANR device may be balanced against its overload performance by adaptively adjusting the VGA 552 and the tunable filter 554 based on the environment of the ANR device. In some implementations, the noise reduction performance may be improved by increasing the gain of the VGA 552. For example, the ANR device may introduce system-generated noise (e.g., noise generated by the electronics disposed in the signal flow path), which may be manifested as a substantially constant audible "hiss" generated by the acoustic transducer 106. In such cases, increasing the gain of the VGA 552 may in some cases improve the signal-to-noise ratio (SNR), and decrease the undesirable hissing audio generated by the acoustic transducer 106. This may also be referred to as lowering of the "noise floor," and improve user experience particularly in low-noise environments. However, pre-amplifying the gain of the VGA 552 boosts any signals captured using the microphones 557 (e.g., feedback and/or feedforward microphones), which in some cases may result in clipping of the incoming signal. For example, if the gain of the VGA 552 is increased to lower the noise floor, the dynamic range of the system may also be reduced, causing the system (e.g., the electronics of the signal flow path and/or the acoustic transducer 106) to overload more easily. In some cases, such overload conditions may cause the acoustic transducer 106 to produce audible pops and clicks, which in turn may detract from the improved user-experience resulting from the lowered noise floor.

The signal flow path illustrated in FIG. 5B is an example of a system that can be used to balance the noise reduction performance with the overload performance of an ANR device. For example, in quiet environments, where the likelihood of low frequency disturbances (e.g., those caused by low frequency pressure variations in the environment) is low, the gain of the VGA can be adjusted to a relatively high value that reduces the audible noise floor. This in turn may expose the ANR device to a higher likelihood of being driven to overload conditions. Therefore, as soon as an overload condition is detected by the estimator 556, or when the ANR device is moved to an environment where the likelihood of low frequency pressure variations is higher, the parameter selector 558 may be configured to adjust the gain of the VGA to a lower value to reduce the chances of the system being driven to an overload condition. In some cases, if the VGA gain is reduced in a noisier environment, a psychoacoustic effect of the increased noise floor may not be significantly noticeable to a user. However, the adaptive reducing of the gain of the VGA 552 may result in mitigating audible pops and clicks that may otherwise have degraded the user experience due to the occurrence of overload conditions.

In some implementations, when the gain of the VGA 552 is adjusted to a particular level, the filter coefficients of the tunable filter 554 are also adjusted accordingly to compensate for the change in gain of the VGA 552. For example, if the parameter selector 558 increases the gain of the VGA 552 by 6 dB, the parameter selector 558 may also be configured to select an appropriate set of filter coefficients for the tunable filter 554, such that the magnitude response of the tunable filter is reduced by about 6 dB to compensate for the increased gain of the VGA 552. In some cases, such simultaneous adjustment of the VGA and the tunable filter ensures that the overall gain of the signal flow path is substantially constant, and the user experience is substantially uniform.

The VGA 552 is configured to process signals captured by one or more sensors such as microphones 557 and/or non-microphone sensors 555. The microphones 557 can be of various types, possibly depending on, for example, the signal flow path in which the system 550 is disposed. For example, if the system 550 is disposed in a feedforward ANR path, the microphone 557 can include the feedforward microphone of the ANR device, such as the microphone 102 described above. In another example, if the system 550 is disposed in a feedback ANR path, the microphone 557 can include a feedback microphone such as the microphone 104 described above. The sensors 555 can also be of various types. In some implementations, the non-microphone sensors 555 can include, for example, a pressure sensor, an accelerometer, or a gyroscope. Such non-microphone sensors 555 may be used, for example, to detect pressure changes or activities that may prompt a change in the settings of the VGA 552 and/or the tunable filter 554. For example, based on the output of an accelerometer disposed in an ANR headphone, a determination may be made that the user is running or jogging, which in turn may produce low frequency pressure variations at a particular frequency. Based on such a determination, the parameter selector 558 may be configured to adjust the gain associated with the VGA and the filter coefficients of the tunable filter 554. While the system 550 illustrated in FIG. 5B includes both non-microphone sensors 555 and microphones 557, systems that include only microphones 557 or only non-microphone sensors 555 are also possible.

In some implementations, the adjustments to the gain of the VGA 552 and the filter coefficients of the tunable filter 554 may be made based on predicting the onset of a particular event. In some implementations, the environment of a user may be determined based on the output of a global positioning system (GPS) (e.g., one disposed either in the ANR device or in a mobile phone connected to the ANR device), and the settings of the VGA 552 and the tunable filter 554 may be adjusted in accordance with the determination. For example, if the user of the ANR device is determined to be in a library or office, the parameter selector 558 can be configured to adjust the settings of the ANR device in accordance with that typically used in quiet environments. Conversely, if the user is determined to be in a train during commuting hours, the parameter selector 558 can be configured to adjust the settings of the ANR device in accordance with that typically used in noisy environments. In some implementations, the user's environment may be detected based on one or more applications executing on the ANR device and/or a mobile device connected to the ANR device. For example, upon determining that the user has just started an application that tracks the user's running steps, an inference may be made that the user is about to start a run. Accordingly, the parameter selector 558 can be configured to adjust the VGA 552 and the tunable filter 554 to account for the corresponding expected low-pressure variations in the ANR device. In some implementations, information about both the environment and the activity of the user may be used in determining that operating parameters of the VGA 552 and the filter coefficients of the tunable filter.

The parameter selector 558 can be configured to select the operating parameters of the VGA 552 and the tunable filter 554 in various ways. In some implementations, the parameter selector may be configured to access a computer-readable storage device that stores a representation of a look-up table that stores different sets of filter coefficients of the tunable filter 554 linked to different gain values of the VGA 552. In some implementations, the parameter selector can be configured to calculate the filter coefficients of the tunable filter 554 based on a pre-defined relationship with the selected gain values. The gain values to be used in different environments may be empirically determined or calculated as a function of the outputs of one or more sensors such as a pressure sensor or microphone. In some implementations, the gain level of the VGA 552 may also be changed based on user-input received via a user interface. The user interface can be a control such as a switch, knob, or dial disposed on the ANR device, or a software-based graphical user interface displayed on a display device such as one displayed on a connected mobile device.

The estimator 556 can be configured to determine whether any adjustments to the VGA 552 and/or the tunable filter 554 are needed. Accordingly, the estimator 556 can be configured to signal the parameter selector 558 to adjust one or both of the VGA 552 and the tunable filter 554. In some implementations, the estimator 556 is substantially similar to the estimator 506 described above with reference to FIG. 5A. In some implementations, the estimator 556 can be a displacement estimator configured to estimate whether the drive signal for the acoustic transducer can potentially cause the transducer to exceed its excursion limit. In some implementations, the estimator 556 can include a pressure estimator configured to detect the occurrence of pressure disturbances in the environment.

The system 550 may be operated in various modes. In some implementations, the system 550 can be configured to run substantially continuously upon initialization. For example, if the system 550 is disposed in a feedforward or feedback path of an ANR headphone, the system may be initialized when the ANR functionality of the headphone is activated, and then allowed to run during the operating period of the headphone. In some cases though, such a mode of operation may cause multiple pops and clicks, which could degrade the user experience to some extent. In some implementations, the system 550 can include a control (e.g., a button) to deactivate/activate the system 550 based on user-input. In some implementations, instead of performing continuous adjustments upon activation, the system 550 could be configured such that the parameter selector 558 adjusts the VGA 552 and the tunable filter 554 in accordance with the current environment, and then either shuts off or goes into standby mode. The system may be reactivated based on a user-input which indicates that the environment has changed, or that a readjustment is otherwise desired. In some implementations, the system 550 or the ANR device in which it is deployed may include one or more controls (e.g., hardware buttons and/or software controls presented on a user interface) for selecting the mode of operation of the system 550.

In a mode of operation in which the system 550 automatically adjusts the gain of the VGA 552 and the filter coefficients of the tunable filter 554, the adjustments may be performed in various ways. In some implementations, the adjustments are performed substantially periodically. For example, the adjustments may be performed with a time period of about 100 ms or more. The frequency of adjustments may be selected empirically, for example, to allow the system 550 to adequately adjust to changing environments. In some implementations, the adjustments can be performed upon detection of a change in the environment. For example, if the estimator 556 detects a signal indicative of a change in the environment (e.g., the occurrence of a low frequency pressure event), the estimator may signal the parameter selector 558 to adjust the VGA 552 and the tunable filter 554 accordingly.

In some implementations, in order to prevent the system 550 from adjusting too frequently, a decision threshold may be associated with the adjustments. In some implementations, an adjustment may be made only if the amount of required change in the gain of the VGA 552 exceeds a threshold amount. For example, an adjustment may be made only if the gain adjustment is 2.25 dB or higher. The threshold amount may be determined empirically, for example, to prevent overly frequent adjustments.

The adjustments to the gain level of the VGA 552 can be performed in various ways. In some implementations, the adjustments may be made in a single step. In some implementations, the adjustments may be made as a series of multiple steps. For example, if an adjustment of 6 dB needs to be made, the adjustments may be made as a single step change of 6 dB, or a series of six steps each implementing a 1 dB change, or another combination of steps. The step sizes may be determined empirically, for example, based on the tolerance for any associated audible artifacts generated by the step changes. In some implementations, the time gap between the steps may also be adjusted, for example, to reduce the possibility of multiple audible artifacts to be merged into a single louder artifact. However, increasing the gap between the steps also increases the total adjustment time. The spacing between the steps can therefore be selected empirically in accordance with a target tradeoff between the adjustment time and the tolerable audible artifacts.

Figure 7:
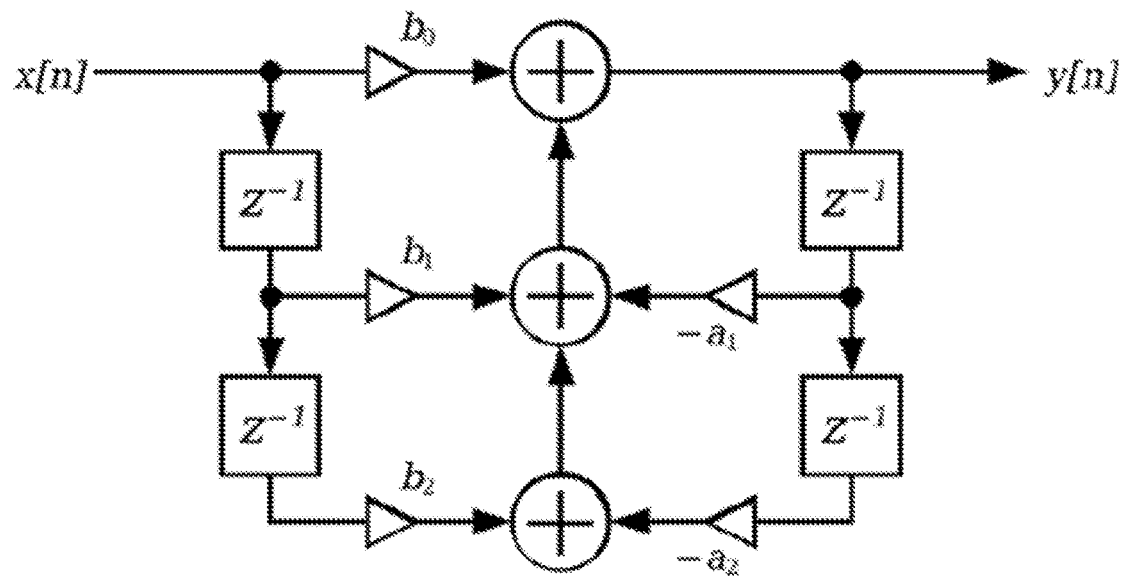
FIG. 7 is a block diagram of an example bi-quad notch filter that can be used as a tunable filter in an ANR signal flow path.

FIG. 7 is a block diagram of an example bi-quad notch filter that can be used as a tunable filter in an ANR signal flow path. The transfer function of the filter is given by:

$$H(z) = \frac{b_0 + b_1 z^{-1} + b_2 z^{-2}}{1 + a_1 z^{-1} + a_2 z^{-2}} \quad (4)$$

Figure 8A:
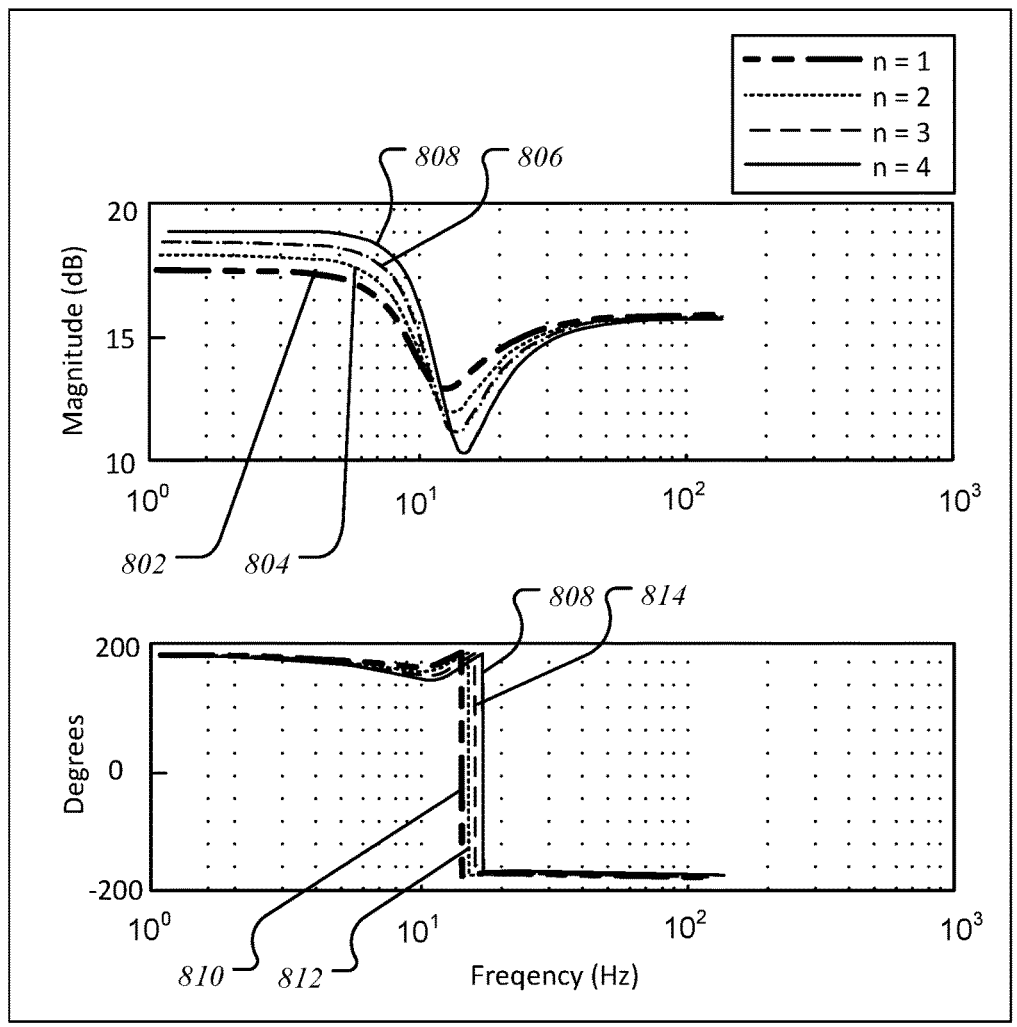
FIG. 8A shows magnitude and phase responses of the bi-quad notch filter of FIG. 7 for different combinations of filter coefficients.
Figure 8B:
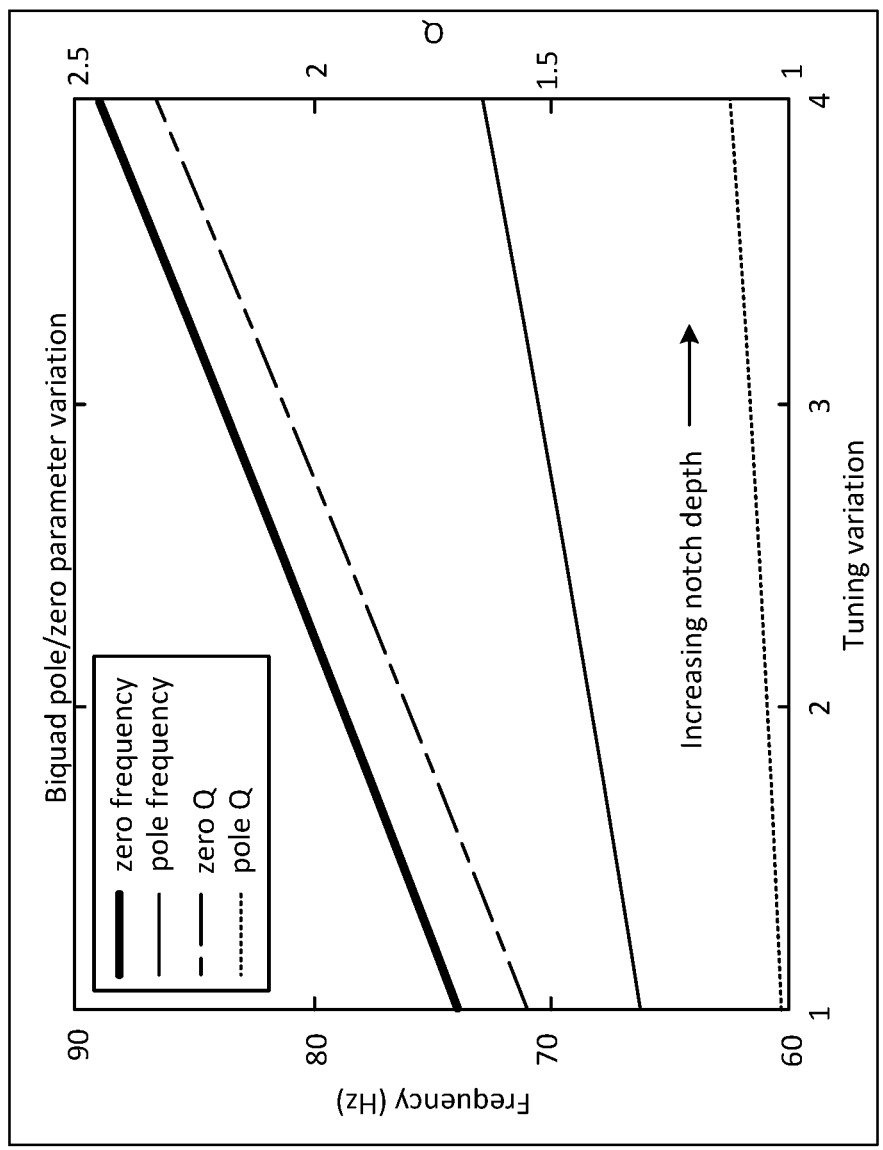
FIG. 8B shows the variation of poles and zeros of the bi-quad notch filter with respect to a tuning parameter n.

In practice, multiple bi-quad notch filters may be cascaded to achieve the desired level of suppression. FIG. 8A shows magnitude and phase responses of a single bi-quad notch filter (as shown in FIG. 7) for different combinations of filter coefficients. The filter coefficients are parameterized by the parameter n. Specifically, the curves 802, 804, 806, and 808 represent the magnitude responses for parameter values n=1, n=2, n=3, and n=4, respectively. The curves 810, 812, 814, and 816 represent the phase responses for parameter values n=1, n=2, n=3, and n=4, respectively. FIG. 8B shows the variation of poles and zeros of the bi-quad notch filter with respect to a tuning parameter n in terms of frequency and bi-quad singularities Q. The Q is also known as the quality factor. In FIG. 8B the curves describing the pole and zero frequency and Qs as a function of tuning variation show that the notch sharpness and notch center frequency are coupled. To maintain desirable feedback ANR performance, the notch depth increases with increasing frequency.

Figure 8C:
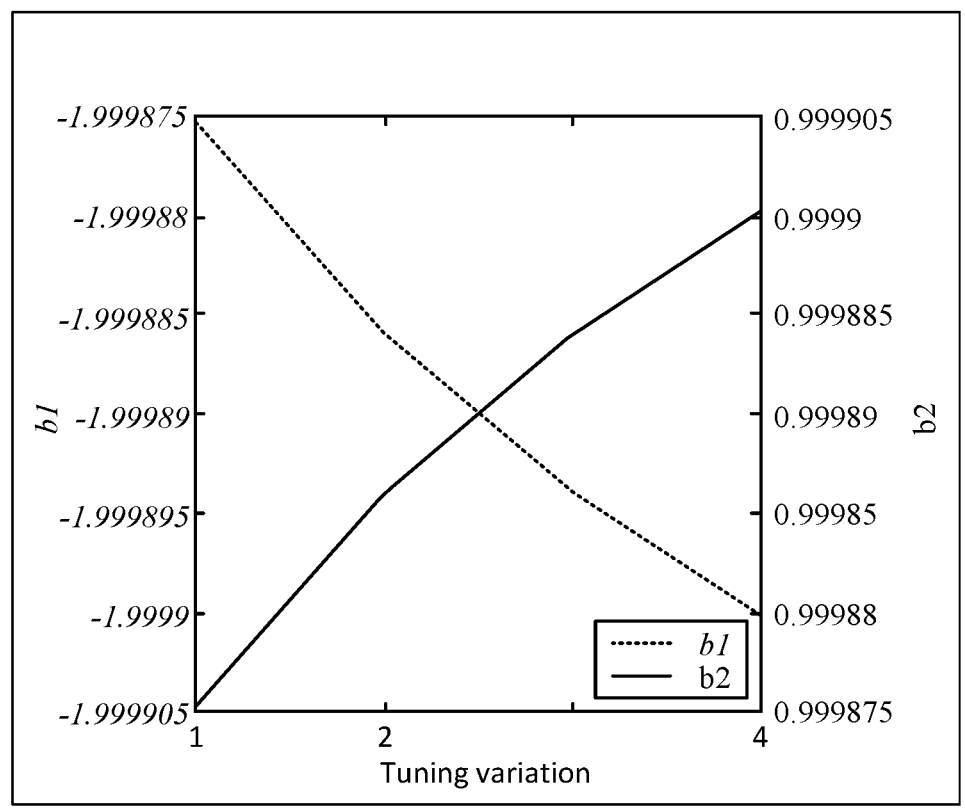
FIGS. 8C and 8D show the variations in coefficient values of the bi-quad notch filter with respect to the tuning parameter n.
Figure 8D:
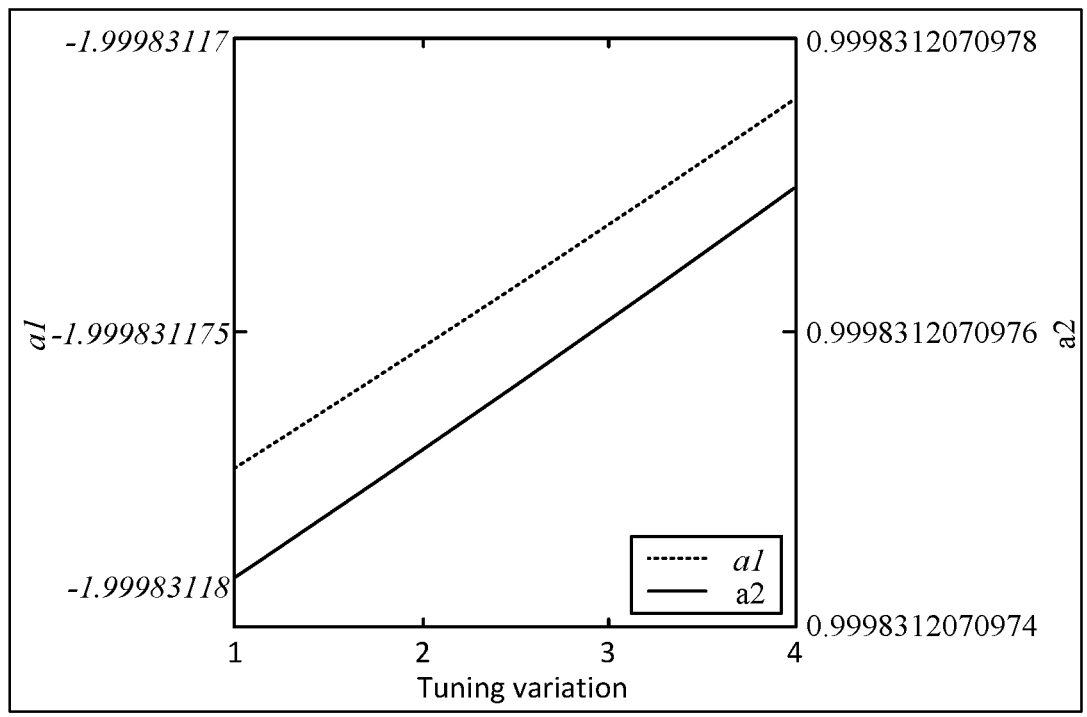

FIGS. 8C and 8D show the variations in filter coefficient values of the bi-quad notch filter with respect to the tuning parameter n. In the particular example shown in FIGS. 8C and 8D, the values of the coefficients b1 and a1 are in the vicinity of 2, and the values of the coefficients b2 and a2 are in the vicinity of unity. This is related to the particular implementation which uses a sample rate of 384000 samples per second, which is greater than the desired 15 Hz notch frequency. In some implementations, the filter coefficient values (e.g., b1, b2, a1 and a2, in the present example) can be stored in a look-up table, or derived from mapping rules such as the frequency/Q mapping illustrated in FIG. 8B.

Figure 9A:
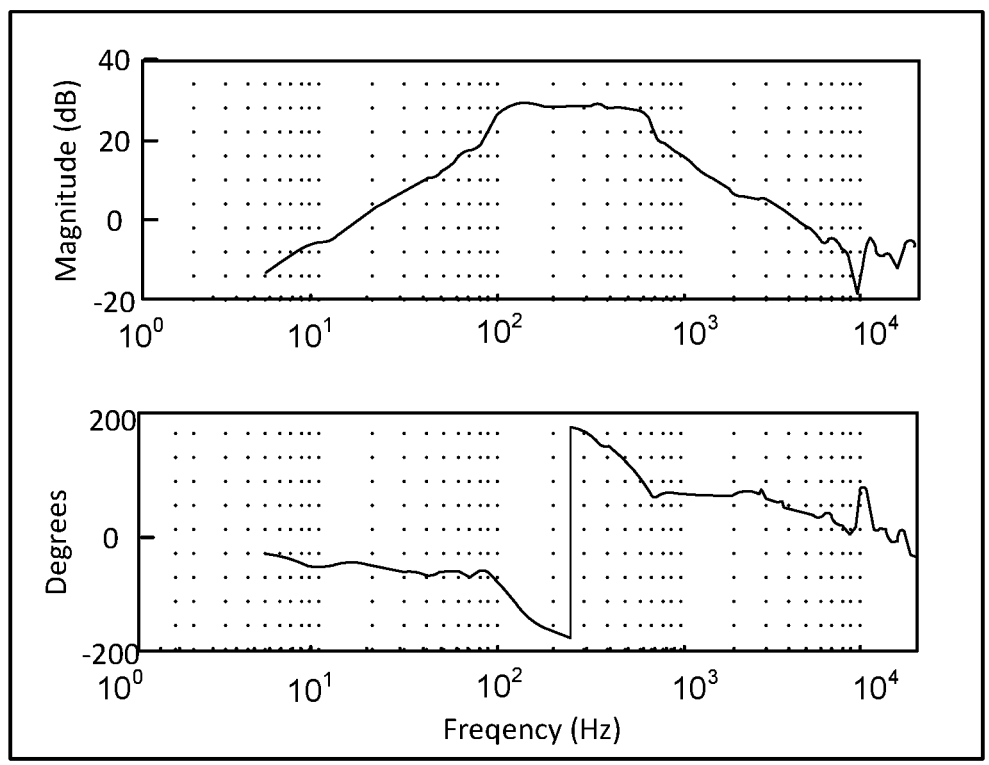
FIG. 9A shows magnitude and phase responses of a feedback path loop gain of an example ANR device without a tunable filter.
Figure 9B:
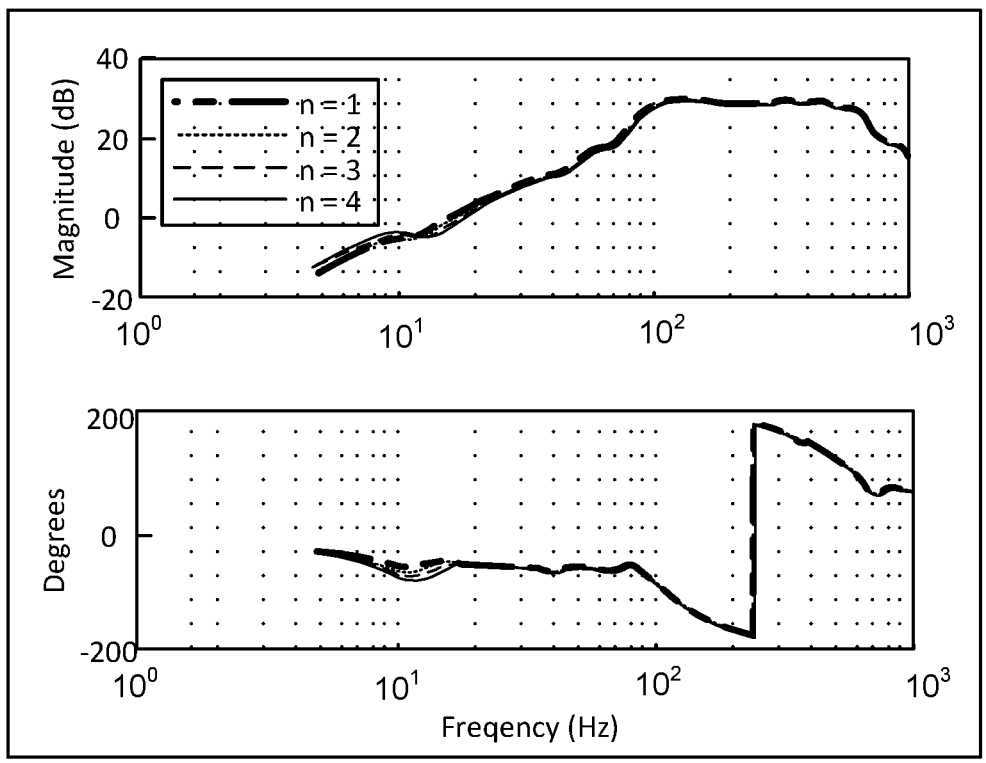
FIG. 9B shows magnitude and phase responses of the feedback path loop gain of FIG. 9, but with a tunable filter.
Figure 10A:
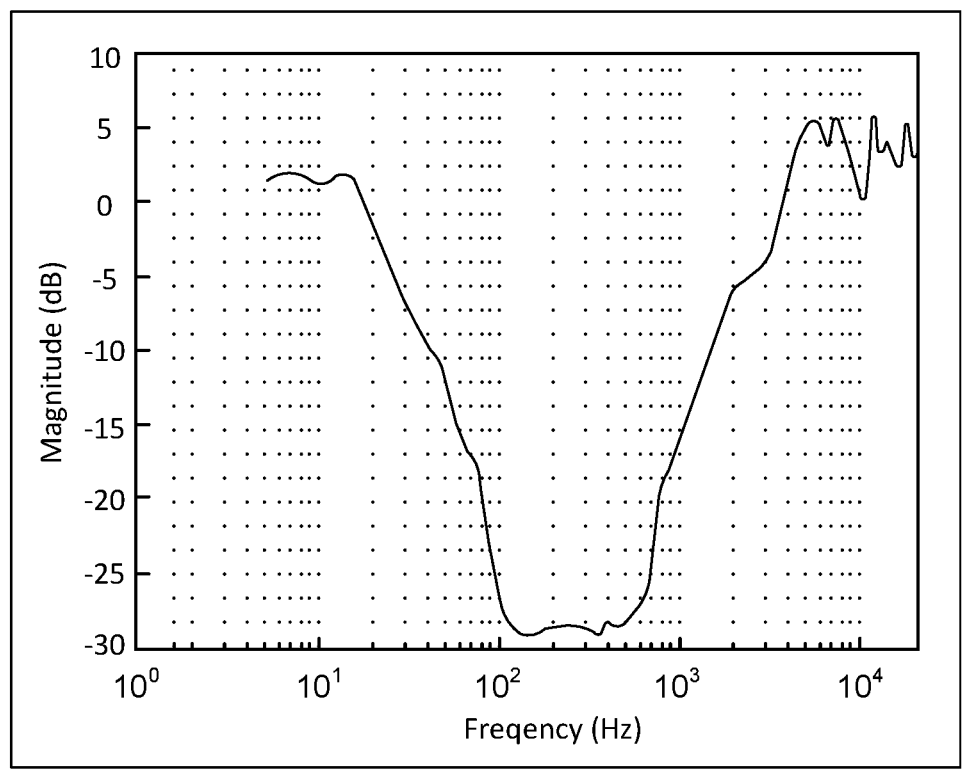
FIG. 10A shows the sensitivity of a feedback path of an example ANR device without a tunable filter.
Figure 10B:
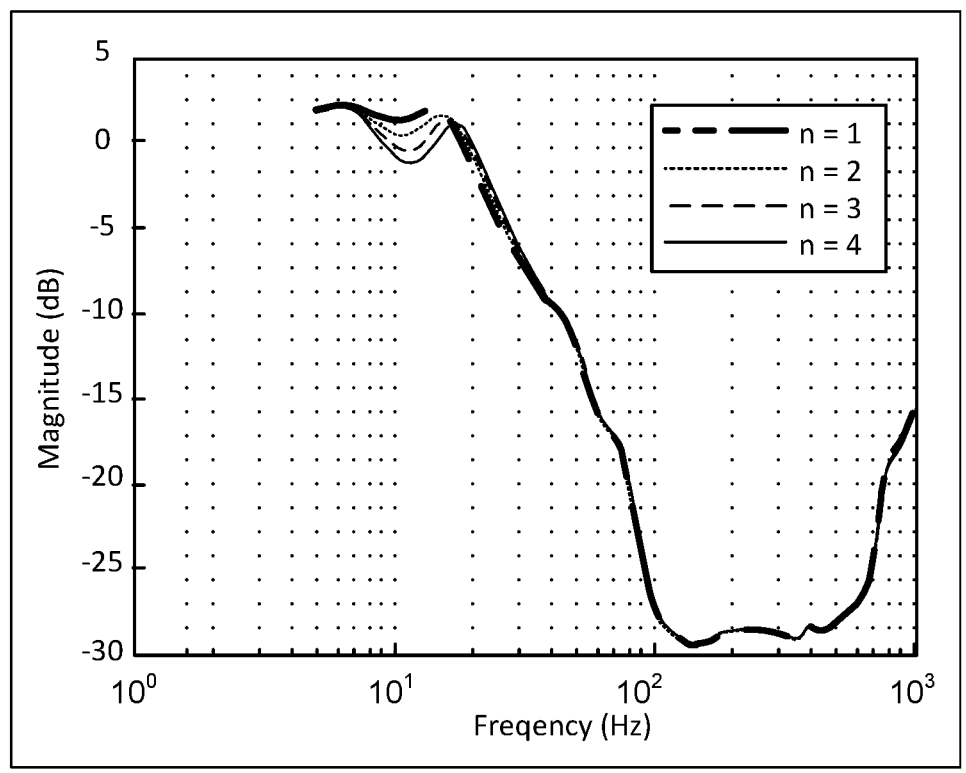
FIG. 10B shows the sensitivity of the feedback path of FIG. 10A, but with a tunable filter.

FIGS. 9A-9B, and FIGS. 10A-10B illustrate the performance of a tunable filter in the feedback path. Specifically, FIGS. 9A and 9B show magnitude and phase responses of the loop gain (provided as a product of the driver-voltage-to-feedback-microphone-voltage transfer function and the feedback compensator transfer function $K_{fb}$) of the feedback path without a tunable filter and with a tunable filter, respectively. The particular tunable filter used in this example included twelve cascaded bi-quad notch filters, each of which were substantially similar to the bi-quad notch filter illustrated in FIG. 7. As illustrated by FIG. 9B, the tunable filter remains stable and exhibits consistent loop gain behavior for the various values of the tuning parameter n. Further, as illustrated by FIGS. 10A and 10B, which show the sensitivity of a feedback path of the example ANR device without a tunable filter (FIG. 10A), and with a tunable filter (FIG. 10B), the sensitivity of the filters also remains consistent for the various values of the tuning parameter.

Figure 11:
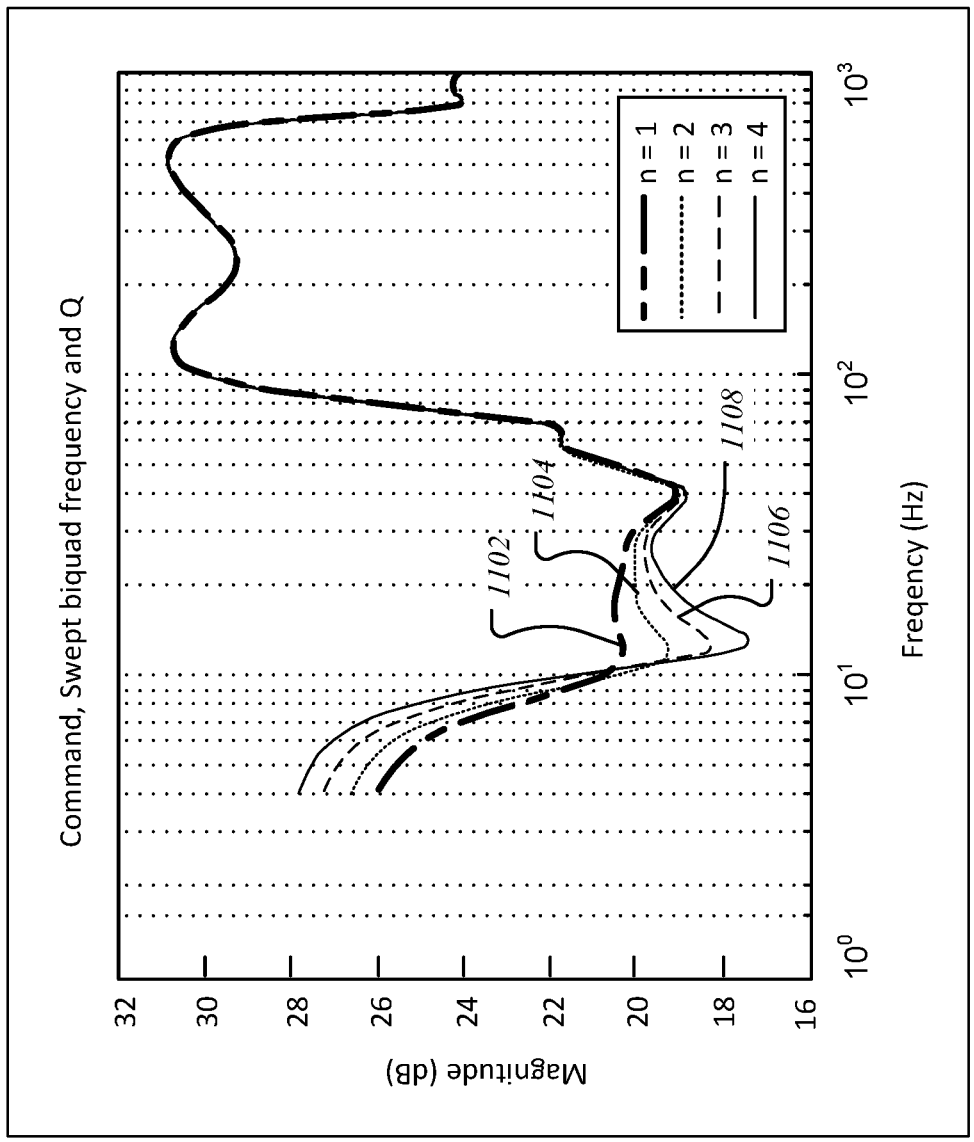
FIG. 11 shows the variation in output voltage of a feedback compensator for various values of the tuning parameter of a tunable filter connected in series.

FIG. 11 shows the variation in output voltage of the feedback compensator 116 for the various values of the tuning parameter n. Specifically, the curves 1102, 1104, 1106, and 1108 represent the variations in the feedback compensator output for parameter values n=1, n=2, n=3, and n=4, respectively. As illustrated by these curves, the parameter value can be adjusted to get different levels of suppression at around the desired 15 Hz frequency, without significantly affecting the feedback compensator output at other frequencies.

Figure 12A:
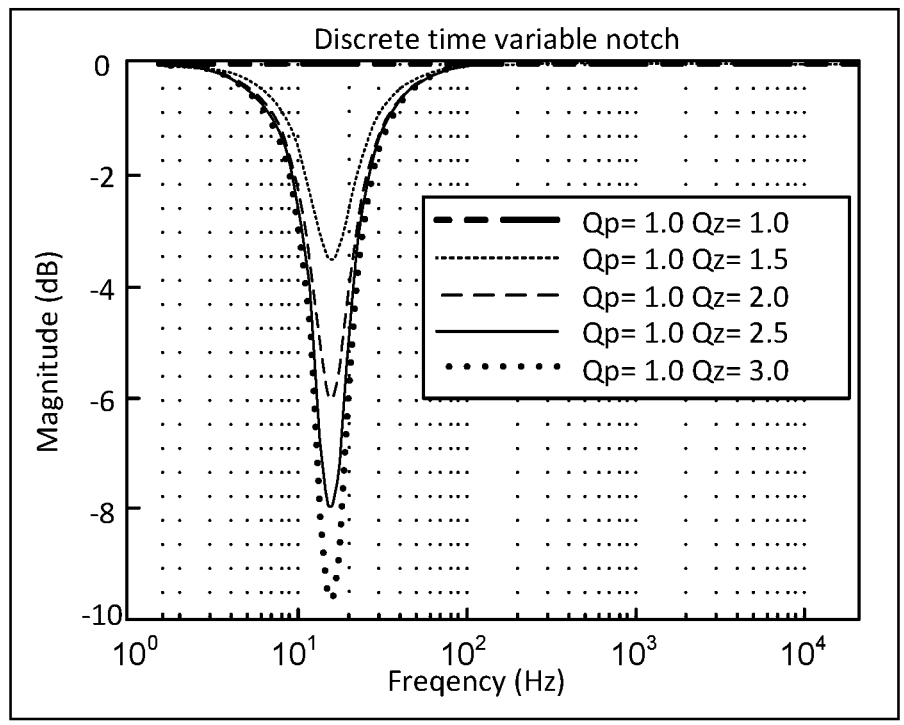
FIG. 12A shows the magnitude response of another example of a notch filter that can be used as a tunable filter in an ANR signal flow path.
Figure 12B:
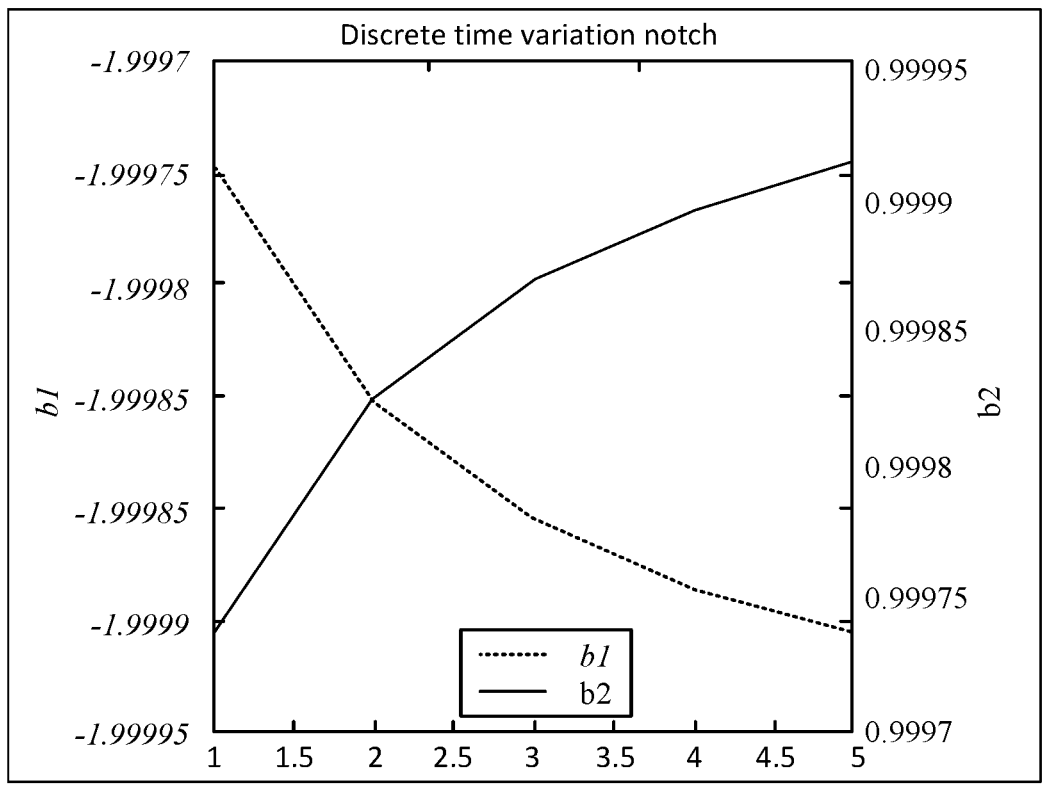
FIG. 12B shows the variation in coefficient values of the notch filter represented in FIG. 12A.

FIG. 12A shows the magnitude response of another example of a notch filter that can be used as a tunable filter in the feedback path. This notch filter is another single bi-quad notch filter such as the one illustrated in FIG. 7, but with the coefficients a1 and a2 held to be constants. In this example, the frequency of the complex poles and zeros were equal and the Q of the zeros was varied to change the depth of the notch, which resulted in changes to the coefficients b1 and b2 only. Such variations of the coefficients are illustrated in FIG. 12B.

Figure 13:
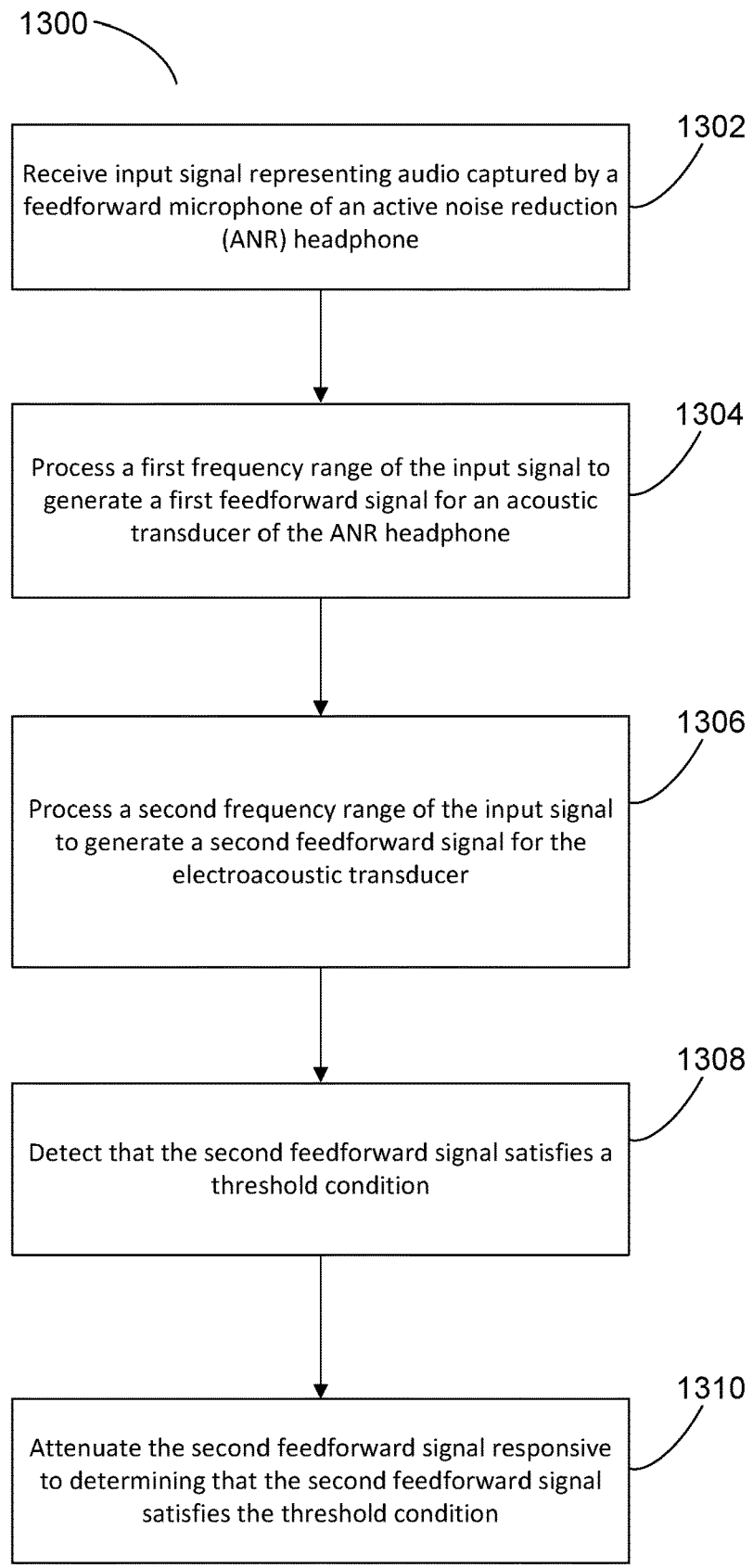
FIG. 13 is a flowchart of an example process for implementing parallel feedforward compression in accordance with technology described herein.

FIG. 13 is a flowchart of an example process 1300 for implementing parallel feedforward compression in accordance with technology described above. At least a portion of the process 1300 can be implemented using one or more processing devices such as DSPs described in U.S. Pat. Nos. 8,073,150 and 8,073,151, incorporated herein by reference in their entirety. Operations of the process 1300 include receiving an input signal representing audio captured by a feedforward microphone of an ANR device such as an ANR headphone (1302). In some implementations, the ANR device can be an in-ear headphone such as the one described with reference to FIG. 1. In some implementations, the ANR device can include, for example, around-the-ear headphones, over-the-ear headphones, open headphones, hearing aids, or other personal acoustic devices. In some implementations, the feedforward microphone can be a part of an array of microphones.

Operations of the process 1300 also include processing a first frequency range of the input signal to generate a first feedforward signal for an acoustic transducer of the ANR headphone (1304). This can be done using a first feedforward compensator disposed in the ANR device to generate anti-noise signals to reduce or cancel noise signals picked up by the feedforward microphone. In some implementations, generating the first feedforward signal includes processing the input signal by a first filter to generate a first filtered signal, and processing the first filtered signal by the first feedforward compensator to generate the first feedforward signal. The first filter can be a high-pass or band-pass filter having a passband that includes the first frequency range. The first feedforward signal represents an anti-noise signal configured to reduce a noise signal in the first filtered signal.

The process 1300 also includes processing a second frequency range of the input signal to generate a second feedforward signal for the acoustic transducer (1306). This can be done, for example, by a second feedforward compensator disposed in parallel to the first feedforward compensator. In some implementations, the first frequency range includes frequencies higher than the frequencies in the second frequency range. For example, an upper limit of the second frequency range can be substantially equal to 100 Hz, whereas the lower limit of the first frequency range can be greater than or substantially equal to 100 Hz. In some implementations, the first frequency range can include at least a portion of the second frequency range. In some implementations, generating the second feedforward signal includes processing the input signal by a second filter to generate a second filtered signal, and processing the second filtered signal by the second feedforward compensator to generate the second feedforward signal. The second filter can have a passband that includes the second frequency range, and the second feedforward signal can represent an anti-noise signal configured to reduce a noise signal in the second filtered signal.

Operations of the process 1300 further include detecting that the second feedforward signal satisfies a threshold condition (1308). This can include, for example, determining that a voltage level representing the second feedforward signal reaches or exceeds a threshold to indicate an overdrive condition of the electroacoustic transducer. This can also include, for example, filtering the second feedforward signal using a digital filter, and comparing the filtered second feedforward signal to a value associated with the threshold condition. The set of coefficients of the digital filter can be selected based on a mode of operation of the ANR headphone.

Operations of the process 1300 also include attenuating the second feedforward signal responsive to determining that the second feedforward signal satisfies the threshold condition (1310). For example, if the second feedforward signal satisfies the threshold condition, a determination is made that the second feedforward signal would drive the acoustic transducer, or other portions of the associated electronics, to overload, and accordingly, a variable gain amplifier in the signal path of the second feedforward signal is adjusted to attenuate the second feedforward signal.

Operations of the process can also include, for example, generating a combined feedforward signal for the acoustic transducer by summing the second feedforward signal and the first feedforward signal, or by summing the attenuated second feedforward signal and the first feedforward signal. The acoustic transducer can then be driven using, in part, the combined feedforward signal.

All of the various signal topologies and filter designs described above can be implemented in the configurable digital signal processor described in the cited patents. These topologies and filter designs may also be implemented in analog circuits, or in a combination of analog and digital circuits, using conventional circuit design techniques, though the resulting product may be larger or less flexible than one implemented using an integrated, configurable digital signal processor.

Figure 14:
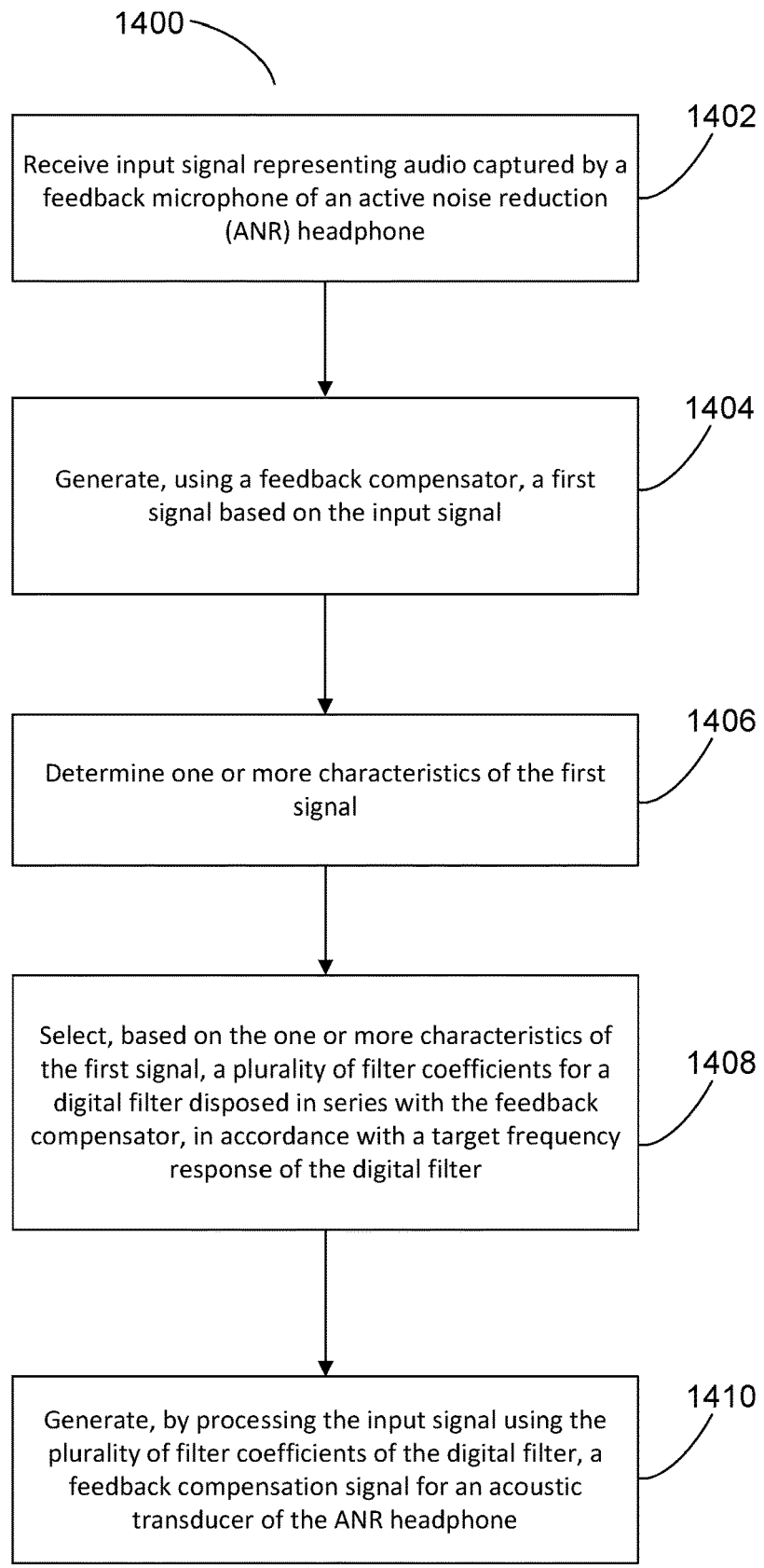
FIG. 14 is a flowchart of an example process for implementing a tunable filter in a feedback path of an ANR device in accordance with technology described herein.

FIG. 14 is a flowchart of an example process 1400 for implementing a tunable filter in a feedback path of an ANR device in accordance with technology described above. At least a portion of the process 1400 can be implemented using one or more processing devices such as DSPs described in U.S. Pat. Nos. 8,073,150 and 8,073,151, incorporated herein by reference in their entirety. Operations of the process 1400 include receiving an input signal representing audio captured by a feedback microphone of an ANR device such as an ANR headphone (1402). In some implementations, the ANR device can be an in-ear headphone such as one described with reference to FIG. 1. In some implementations, the ANR device can include, for example, around-the-ear headphones, over-the-ear headphones, open headphones, hearing aids, or other personal acoustic devices. In some implementations, the feedback microphone can be a part of an array of microphones.

Operations of the process 1400 also include generating, by a feedback compensator and based on the input signal, a first signal (1404). In some implementations, the feedback compensator can be substantially similar to the fixed filter 504 described above with reference to FIG. 5A. For example, the first signal can include an anti-noise signal generated in response to a noise detected by a feedback microphone, wherein the anti-noise signal is configured to cancel or at least reduce the effect of the noise.

The operations of the process 1400 include determining one or more characteristics of the first signal (1406). This can be done, for example, using a module substantially similar to the estimator 506 described above with reference to FIG. 5A. The one or more characteristics can include a voltage level of the first signal, the voltage level being indicative of an amount of excursion or driver displacement of the corresponding acoustic transducer 106. In some implementations, the one or more characteristics can be indicative of a frequency or frequency range of the input signal where the underlying noise is detected.

The operations of the process 1400 further include selecting, based on the one or more characteristics of the first signal, a plurality of filter coefficients for a digital filter disposed in series with the feedback compensator (1408). The plurality of filter coefficients can be selected, for example, in accordance with a target frequency response of the digital filter. For example, if the one or more characteristics of the first signal indicate that the voltage level of the first signal can potentially drive the corresponding acoustic transducer to an overload condition, and that the underlying noise in the input signal is in the vicinity of 15 Hz, the plurality of coefficients can be chosen to configure the digital filter as a high-pass or notch filter to suppress or attenuate components of the input signal around 15 Hz. In some implementations, selecting the plurality of coefficients can be done by accessing a pre-stored look-up table that includes parameter or coefficient values for the digital filter for various combinations of the one or more characteristics determined for the first signal. In some implementations, the digital filter is substantially similar to the tunable filter described above with reference to FIGS. 5A and 5B.

The digital filter may be disposed in the feedback path of an ANR device in series with a feedback compensator, and either before or after the feedback compensator. In some implementations, the digital filter may be integrated together with the feedback compensator in the form of a combined set of coefficients. For example, with reference to FIG. 5A, the tunable filter 502 and the fixed filter 504 may be combined in the form of a unified filter providing feedback compensation. The digital filter may be implemented in various forms, including for example, as an infinite impulse response (IIR) filter or a finite impulse response (FIR filter).

Operations of the process 1400 also include generating, by processing the input signal using the plurality of filter coefficients of the digital filter, a feedback compensation signal for an acoustic transducer of the ANR headphone (1410). In some implementations, once the input signal is processed by the digital filter with selected coefficients, a portion of the input signal causing the generation of out-of-range feedback compensation signals may be attenuated, thereby preventing any potential overload conditions in the acoustic transducer. In some implementations, this may improve user experience by avoiding audible artifacts that are otherwise generated by such overload conditions.

Figure 15:
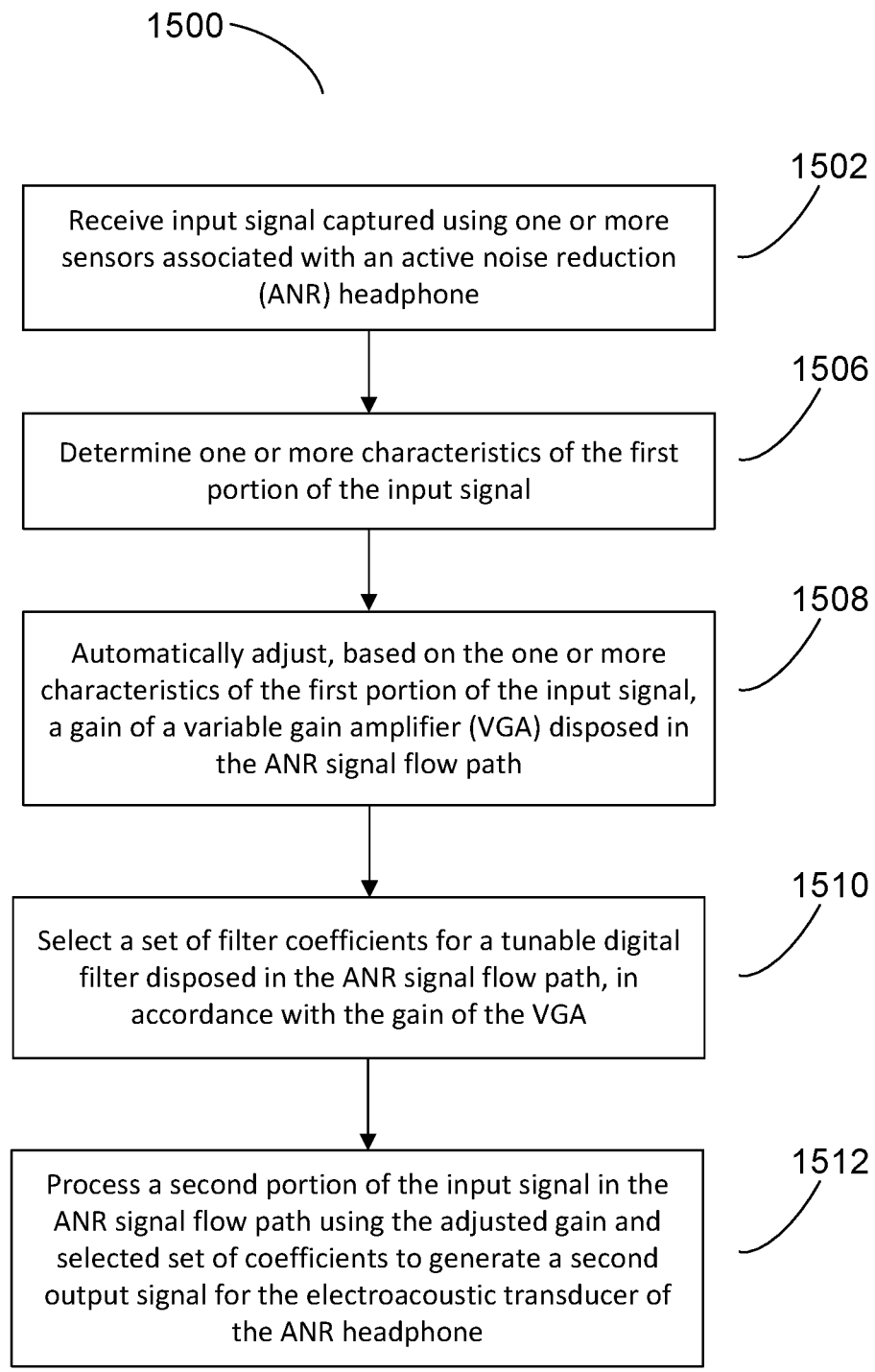
FIG. 15 is a flowchart of an example process for implementing a combination of a variable gain amplifier (VGA) in combination with a tunable filter in a signal flow path of an ANR device.

FIG. 15 is a flowchart of an example process 1500 for implementing a combination of a variable gain amplifier (VGA) in combination with a tunable filter in a signal flow path of an ANR device in accordance with technology described above. At least a portion of the process 1500 can be implemented using one or more processing devices such as DSPs described in U.S. Pat. Nos. 8,073,150 and 8,073,151, incorporated herein by reference in their entirety. Operations of the process 1500 include receiving an input signal captured by one or more sensors associated with an ANR device such as an ANR headphone (1502). In some implementations, the one or more sensors can include one or more of a feedforward microphone and feedback microphone of the ANR headphone. In some implementations, the one or more sensors include one or more of a pressure sensor, an accelerometer, and a displacement sensor configured to sense an amount of excursion of the electroacoustic transducer.

Operations of the process 1500 also include determining one or more characteristics of the first portion of the input signal (1506). In some implementations, the one or more characteristics of the first portion of the input signal is indicative of a noise floor associated with the external environment of the ANR headphone. In some implementations, determining the one or more characteristics of the first portion of the input signal includes processing the first portion of the input signal to generate a first output signal for an electroacoustic transducer of the ANR headphone, and determining the one or more characteristics of the first portion of the input signal based on one or more characteristics of the first output signal. For example, determining the one or more characteristics of the first portion of the input signal based on one or more characteristics of the first output signal can include determining that the first output signal is clipped. In some implementations, the one or more characteristics of the first portion of the input signal is indicative of a likelihood that an output signal resulting from processing of the first portion of the input signal by the ANR signal flow path would be clipped. In some implementations, determining the one or more characteristics of the first portion of the input signal includes determining a non-linear relationship between the first portion of the input signal and the first output signal. For example, a non-linear relationship may be manifested by an output signal that causes an acoustic transducer to generate an audible artifact such as a pop or click.

Operations of the process 1500 also include automatically adjusting based on the one or more characteristics of the first portion of the input signal, a gain of a variable gain amplifier (VGA) disposed in the ANR signal flow path (1508). In some implementations, the gain of the VGA is adjusted periodically during an operation of the ANR headphone. The time period of the adjustments may be determined empirically, and can be, for example, at least about 100 ms. In some implementations, the gain of the VGA is adjusted responsive to determining that the one or more characteristics of the first portion of the input signal or the first output signal satisfies a threshold condition. The threshold condition can include, for example, an amount of required gain adjustment. For example, the gain of the VGA may be adjusted only if the required adjustment is at least 2.25 dB.

Operations of the process 1500 also include selecting a set of coefficients for a tunable digital filter disposed in the ANR signal flow path in accordance with the gain of the VGA (1510). For example, if the gain of the VGA is adjusted by a particular amount (e.g., 5 dB), the set of coefficients for the tunable digital filter may be selected such that the magnitude response of the filter due to the selected coefficients compensates for the gain adjustment of the VGA. This may be done, for example, to keep the overall gain of the signal flow path substantially unchanged.

Operations of the process 1500 further include processing a second portion of the input signal in the ANR signal flow path using the adjusted gain and selected set of coefficients to generate a second output signal for the electroacoustic transducer of the ANR headphone (1512). In some implementations, the second output signal reduces the chances of the system 550 being driven to an overload condition, as compared to the first output signal. The process 1500 may therefore be used for mitigating overload conditions in a feedforward or feedback path of the ANR headphone.

The functionality described herein, or portions thereof, and its various modifications (hereinafter "the functions") can be implemented, at least in part, via a computer program product, e.g., a computer program tangibly embodied in an information carrier, such as one or more non-transitory machine-readable media or storage device, for execution by, or to control the operation of, one or more data processing apparatus, e.g., a programmable processor, a computer, multiple computers, and/or programmable logic components.

A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a network.

Actions associated with implementing all or part of the functions can be performed by one or more programmable processors executing one or more computer programs to perform the functions of the calibration process. All or part of the functions can be implemented as, special purpose logic circuitry, e.g., an FPGA and/or an ASIC (application-specific integrated circuit). In some implementations, at least a portion of the functions may also be executed on a floating point or fixed point digital signal processor (DSP) such as the Super Harvard Architecture Single-Chip Computer (SHARC) developed by Analog Devices Inc.

Processors suitable for the execution of a computer program include, by way of example, both general and special purpose microprocessors, and any one or more processors of any kind of digital computer. Generally, a processor will receive instructions and data from a read-only memory or a random access memory or both. Components of a computer include a processor for executing instructions and one or more memory devices for storing instructions and data.

Other embodiments and applications not specifically described herein are also within the scope of the following claims. For example, the parallel feedforward compensation may be combined with a tunable digital filter in the feedback path. In another example, a tunable digital filter in the feedforward path may be combined with a parallel compensation scheme in the feedback path. In some implementations, various combinations of the parallel compensation technique, tunable filter technique, and the VGA technique may be used in the ANR signal flow paths (e.g., a feedback path or a feedforward path) of an ANR device. In some implementations, an ANR signal flow path can include a tunable digital filter as well as a parallel compensation scheme to attenuate generated control signal in a specific portion of the frequency range.

Elements of different implementations described herein may be combined to form other embodiments not specifically set forth above. Elements may be left out of the structures described herein without adversely affecting their operation. Furthermore, various separate elements may be combined into one or more individual elements to perform the functions described herein.

What is claimed is:

1. A method comprising:
receiving an input signal representing audio captured by a microphone of an active noise reduction (ANR) headphone;
processing, by a first compensator, a first frequency range of the input signal to generate a first signal for an acoustic transducer of the ANR headphone, wherein the first signal generated by the first compensator includes a first anti-noise signal configured to reduce a noise signal in the first frequency range;
processing, by a second compensator disposed in parallel to the first compensator, a second frequency range of the input signal to generate a second signal for the acoustic transducer, wherein the second signal generated by the second compensator includes a second anti-noise signal configured to reduce a noise signal in the second frequency range;
filtering, by a filter, the second signal to produce a filtered second signal;
detecting, by one or more processing devices, whether the filtered second signal satisfies a threshold condition by comparing the filtered second signal with a threshold;
responsive to detecting that the filtered second signal satisfies the threshold condition,
generating a control signal configured to adjust a variable gain amplifier that attenuates the second signal without attenuating the first signal, and
generating a combined signal for the acoustic transducer by summing the first signal and the attenuated second signal; and
responsive to detecting that the filtered second signal fails to satisfy the threshold condition,
generating the combined signal for the acoustic transducer by summing the first signal and the second signal.

2. The method of claim 1, further comprising driving the acoustic transducer using the combined signal.

3. The method of claim 1, wherein an upper limit of the second frequency range is substantially equal to 100 Hz.

4. The method of claim 1, wherein the first frequency range includes at least a portion of the second frequency range.

5. The method of claim 1, wherein detecting that the filtered second signal satisfies the threshold condition comprises determining that a voltage level representing the filtered second signal reaches or exceeds a threshold to indicate an overload condition.

6. The method of claim 1, wherein a set of coefficients of the filter is selected based on a mode of operation of the ANR headphone.

7. The method of claim 1, wherein processing the first frequency range of the input signal to generate the first signal comprises:
processing the input signal by a first filter to generate a first filtered signal, the first filter having a passband that includes the first frequency range; and
processing the first filtered signal by the first compensator to generate the first signal.

8. The method of claim 1, wherein processing the second frequency range of the input signal to generate the second signal comprises:
processing the input signal by a second filter to generate a second filtered signal, the second filter having a passband that includes the second frequency range; and
processing the second filtered signal by the second compensator to generate the second signal.

9. An active noise reduction (ANR) device comprising:
one or more sensors configured to generate an input signal indicative of an external environment of the ANR device;
a first compensator configured to process a first frequency range of the input signal to generate a first signal for an acoustic transducer of the ANR device, wherein the first signal generated by the first compensator includes a first anti-noise signal configured to reduce a noise signal in the first frequency range;
a second compensator disposed in parallel to the first compensator, the second compensator configured to process a second frequency range of the input signal to generate a second signal for the acoustic transducer, wherein the second signal generated by the second compensator includes a second anti-noise signal configured to reduce a noise signal in the second frequency range;

a filter configured to filter the second signal to produce a filtered second signal; and one or more processing devices configured to:
detect whether the filtered second signal satisfies a threshold condition by comparing the filtered second signal with a threshold,
responsive to detecting that the filtered second signal satisfies the threshold condition,
generating a control signal configured to adjust a variable gain amplifier that attenuates the second signal without attenuating the first signal, and
generating a combined signal for the acoustic transducer by summing either (i) the first signal and the attenuated second signal, and
responsive to detecting that the filtered second signal fails to satisfy the threshold condition,
generating the combined signal for the acoustic transducer by summing the first signal and the second signal.

10. The ANR device of claim 9, wherein an upper limit of the second frequency range is substantially equal to 100 Hz.

11. The ANR device of claim 9, wherein a set of coefficients of the filter is selected based on a mode of operation of the ANR device.

12. The ANR device of claim 9, wherein detecting that the filtered second signal satisfies the threshold condition comprises determining that a voltage level representing the second signal reaches or exceeds a threshold to indicate an overload condition.

13. The ANR device of claim 9, further comprising:
a first filter configured to process the input signal to generate a first filtered signal, the first filter having a passband that includes the first frequency range,
wherein the first filtered signal is processed by the first compensator to generate the first signal.

14. The ANR device of claim 9, further comprising:
a second filter configured to process the input signal to generate a second filtered signal, the second filter having a passband that includes the second frequency range,
wherein the second filtered signal is processed by the second compensator to generate the second signal.

15. One or more machine-readable storage devices having encoded thereon computer readable instructions for causing one or more processing devices to perform operations comprising:
receiving an input signal representing audio captured by a microphone of an active noise reduction (ANR) headphone;

causing a first compensator to process a first frequency range of the input signal to generate a first signal for an acoustic transducer of the ANR headphone, wherein the first signal generated by the first compensator includes a first anti-noise signal configured to reduce a noise signal in the first frequency range;

causing a second compensator, disposed in parallel to the first compensator, to process a second frequency range of the input signal to generate a second signal for the acoustic transducer, wherein the second signal generated by the second compensator includes a second anti-noise signal configured to reduce a noise signal in the second frequency range;

causing a filter to filter the second signal to produce the second signal to produce a filtered second signal;

detecting whether the filtered second signal satisfies a threshold condition by comparing the filtered second signal with a threshold; and responsive to detecting that the filtered second signal satisfies the threshold condition,
generating a control signal configured to adjust a variable gain amplifier that attenuates the second signal without attenuating the first signal, and
generating a combined signal for the acoustic transducer by summing the first signal and the attenuated second signal; and responsive to detecting that the filtered second signal fails to satisfy the threshold condition,
generating the combined signal for the acoustic transducer by summing the first signal and the second signal.

16. The one or more machine-readable storage devices of claim 15, wherein an upper limit of the second frequency range is substantially equal to 100 Hz.

17. The one or more machine-readable storage devices of claim 15, wherein processing the first frequency range of the input signal to generate the first signal comprises:
processing the input signal by a first filter to generate a first filtered signal, the first filter having a passband that includes the first frequency range; and
processing the first filtered signal by the first compensator to generate the first signal.

18. The one or more machine-readable storage devices of claim 15, wherein processing the second frequency range of the input signal to generate the second signal comprises:
processing the input signal by a second filter to generate a second filtered signal, the second filter having a passband that includes the second frequency range; and
processing the second filtered signal by the second compensator to generate the second signal.

19. The method of claim 1, wherein the filter comprises a sidechain filter.

* * * * *